United States Patent
Van Der Werff et al.

(10) Patent No.: US 10,768,725 B2
(45) Date of Patent: Sep. 8, 2020

(54) TOUCH SENSITIVE CONTROL SYSTEM FOR NON-ELECTRONIC DISPLAY SUBSTRATE SURFACES

(71) Applicant: Resene Paints Limited, Lower Hutt (NZ)

(72) Inventors: Matthew John Van Der Werff, Palmerston North (NZ); Zacharias Johannes Frank, Palmerston North (NZ); Terry Robin Southern, Palmerston North (NZ); Mark William Glenny, Lower Hutt (NZ)

(73) Assignee: Resene Paints Limited (NZ)

( * ) Notice: Subject to any disclaimer, the term of this patent is extended or adjusted under 35 U.S.C. 154(b) by 0 days.

(21) Appl. No.: 16/081,248

(22) PCT Filed: Mar. 1, 2017

(86) PCT No.: PCT/NZ2017/050022
§ 371 (c)(1),
(2) Date: Aug. 30, 2018

(87) PCT Pub. No.: WO2017/150991
PCT Pub. Date: Sep. 8, 2017

(65) Prior Publication Data
US 2019/0073072 A1  Mar. 7, 2019

(30) Foreign Application Priority Data

Mar. 2, 2016 (NZ) .......................................... 717587
Jun. 22, 2016 (NZ) .......................................... 720939

(51) Int. Cl.
*G06F 3/041* (2006.01)
*G06F 3/044* (2006.01)
(Continued)

(52) U.S. Cl.
CPC ............ *G06F 3/041* (2013.01); *G06F 3/0334* (2013.01); *G06F 3/0354* (2013.01);
(Continued)

(58) Field of Classification Search
CPC ......... G06F 3/0416–04186; G06F 3/044–0448
See application file for complete search history.

(56) References Cited

U.S. PATENT DOCUMENTS

| 8,138,882 | B2 | 3/2012 | Do et al. |
| 8,144,129 | B2 * | 3/2012 | Hotelling .............. G06F 1/1626 345/173 |

(Continued)

FOREIGN PATENT DOCUMENTS

FR   WO2012062770   3/2008

*Primary Examiner* — Patrick F Marinelli
(74) *Attorney, Agent, or Firm* — Botkin & Hall, LLP

(57) ABSTRACT

A touch sensitive control system is disclosed, capable of providing touch activated control for use on substrate surfaces such as walls, flooring, doors, furniture, cabinetry, vehicles and machinery. The system may find particular application in large area substrates such as building walls, floors or ceilings, but may alternatively or additionally find application in any other non-active, non-electronic substrate such as furniture, cupboard doors or drawers, or tables for example.

The touch sensitive system comprises at least one electrically active layer having at least one electrical property and configured to be applied to the substrate and an electronic controller. The electrically conductive active layer is configured to have an electrical connection with the electronic controller wherein a differentiated touch on the substrate disrupts the electrical property of the electrically active layer; and wherein the disruption is detected by the electronic controller to provide a control signal. The differenti- (Continued)

ated touch is selected from: one or more of multiple sequential touches, and/or one or more touches of extended duration.

21 Claims, 11 Drawing Sheets

(51) Int. Cl.
    *G06F 3/045*     (2006.01)
    *G06F 3/0488*     (2013.01)
    *G06F 3/0354*     (2013.01)
    *G06F 3/033*     (2013.01)
    *H03K 17/96*     (2006.01)

(52) U.S. Cl.
    CPC .......... *G06F 3/03547* (2013.01); *G06F 3/044* (2013.01); *G06F 3/045* (2013.01); *G06F 3/04186* (2019.05); *G06F 3/04883* (2013.01); *G06F 2203/04106* (2013.01); *H03K 17/962* (2013.01); *H03K 17/9645* (2013.01)

(56) References Cited

U.S. PATENT DOCUMENTS

| | | | |
|---|---|---|---|
| 9,229,038 B2* | 1/2016 | Botten | H03K 17/962 |
| 9,753,564 B2* | 9/2017 | Osawa | H03K 17/9622 |
| 2006/0003242 A1* | 1/2006 | Lee | G03G 5/0525 |
| | | | 430/62 |
| 2007/0156261 A1 | 7/2007 | Caldwell et al. | |
| 2008/0055118 A1 | 3/2008 | Ando et al. | |
| 2008/0186282 A1* | 8/2008 | Nix | B60K 37/00 |
| | | | 345/173 |
| 2008/0309634 A1* | 12/2008 | Hotelling | G06F 1/1626 |
| | | | 345/173 |
| 2012/0128995 A1* | 5/2012 | Leto | C09D 175/04 |
| | | | 428/473 |
| 2012/0139860 A1* | 6/2012 | Hotelling | G06F 1/1626 |
| | | | 345/173 |
| 2012/0237824 A1* | 9/2012 | Koh | H01M 4/663 |
| | | | 429/211 |
| 2012/0319959 A1* | 12/2012 | Saponas | G06F 3/0237 |
| | | | 345/173 |
| 2013/0100033 A1 | 4/2013 | Yuan et al. | |
| 2014/0050908 A1* | 2/2014 | Nashiki | C23C 14/086 |
| | | | 428/216 |
| 2014/0218302 A1 | 8/2014 | Carlson | |
| 2014/0370275 A1* | 12/2014 | Kuchiyama | C23C 14/086 |
| | | | 428/336 |
| 2015/0070599 A1* | 3/2015 | Tomooka | G06F 3/041 |
| | | | 349/12 |
| 2015/0338995 A1* | 11/2015 | Huh | G06F 3/04886 |
| | | | 345/173 |
| 2015/0370377 A1* | 12/2015 | Ohara | G06F 3/044 |
| | | | 345/174 |
| 2016/0117005 A1* | 4/2016 | Osawa | H03K 17/9622 |
| | | | 345/173 |
| 2016/0231098 A1* | 8/2016 | Otaka | G06F 3/044 |
| 2016/0259549 A1* | 9/2016 | Huh | G06F 3/04886 |
| 2016/0264054 A1* | 9/2016 | Uken | B60R 1/088 |
| 2017/0139507 A1* | 5/2017 | Den Boer | C03C 17/3671 |
| 2019/0073072 A1* | 3/2019 | Van Der Werff | G06F 3/01 |

* cited by examiner

A)

B)

TOUCH SENSITIVE CONTROL SYSTEM FOR NON-ELECTRONIC DISPLAY SUBSTRATE SURFACES

CROSS REFERENCE TO RELATED APPLICATIONS

This is the U.S. National Stage of International Application No. PCT/NZ2017/050022 filed on Mar. 1, 2017, which was published in English under PCT Article 21(2), which in turn claims the benefit of New Zealand Patent Nos. 717,587 filed on Mar. 2, 2016 and 720,939 filed on Jun. 22, 2016 all of which are incorporated herein by reference in their entirety.

TECHNICAL FIELD

This invention relates to a touch sensitive control system capable of providing touch activated control for use on substrate surfaces such as walls, flooring, doors, furniture, cabinetry, vehicles and machinery. The invention may find particular application in large area substrates such as building walls, floors or ceilings, but may alternatively or additionally find application in any other non-active, non-electronic substrate such as furniture, cupboard doors or drawers, or tables for example.

INTRODUCTION

It is known to provide touch control of electronic display devices such as smart phones or tablets for example. With such devices, a user may touch the screen of the device to execute a command. Such screens are typically rigid glass with an underlying, transparent conductor. Touching the screen disrupts or alters the electrical properties of the conductor. Such properties may include the conductor's resistance, capacitance or inductance.

There are examples of technology that detect or respond to a human touch being used in other applications. For example, U.S. Pat. No. 8,138,882 relates to a multi-touch floor embedded with a plurality of sensors to identify the shapes, weights, and locations of objects that are in contact with a flooring surface and the means by which information on the identified objects is retrieved, and certain actions are executed based on that information.

Tiles incorporating load cells have also been developed for laying floors and are able to identify the presence of people, and measure aspects of footfalls. This technology has found use in sports science where an athletes' foot position, weight and weight distribution may be measured (http://engineeringsport.co.uk/2012/08/16/how-does-a-smart-floor-work). This type of touch sensitive technology may be effective in improving an athlete's technique and performance.

Other touch sensitive technology includes flooring that uses pressure sensors. The pressure sensors are laid beneath the flooring material on an elevated platform and connected to a PC where responses to pressure may be pre-programmed (http://www.comm.rwth-aachen.de/?article%20id=433&clang=1). This type of technology has been used for a walk on piano.

Smart floors for patient care and monitoring for fall-detection is also known in the prior art. The technology comprises a flooring underlay that may detect and interpret movements. The floor may be used for patient-safety monitoring, without significant privacy implications (http://www.techforfuture.nl/218-Smart Floor.htm).

Also known in the prior art are mats that use pressure sensing technology to trigger a response. These are applied as door entry sensors (e.g. http://www.gizmag.comismart-mat-wi-fi-mat/31402, http://gadgetsin.com/launchpad-smart-floor-mat.htm). Such systems have also found use as fall detectors, for example when an elderly person falls (e.g. http://smartcaregiver.com/fall-prevention/sensor-pads/floor-mat-sensor-pads) and healthcare sensors (e.g. http://www.amexl.com/products/floor sensor.html).

Further, WO 2012/2062770 (FR 2967271) describes an electrical control system for an electrical appliance. The control system comprises a wall or a land having a non-conductive coating layer and an electrically conductive layer. The electrically conductive layer may comprise carbon particles for example. When a person touches the wall or land, this causes a very small change in the capacitance of the electrically conductive layer that is detected by at least one piece of electronics comprising a detection stage. The electronics therefore form a sensor with the wall or the land when someone touches said wall or said land to generate a control signal that switches on the electrical appliance. Whilst the broad concept of an electrically conductive coating is disclosed, there is no detail or appreciation in this document of how to use such a coating to achieve anything more advanced than merely switching an electrical appliance on and off, nor of how to produce a commercially viable and useful coating material.

Any discussion of the prior art throughout the specification should in no way be considered as an admission that such prior art is widely known or forms part of the common general knowledge in the field.

It is an object of the present invention to provide for a touch sensitive system that may be applied to substrate surfaces. Alternatively, it is an object of the invention to at least provide the public with a useful choice.

SUMMARY OF INVENTION

The present technology provides for touch sensitive systems capable of responding in different manner to different touch sequences and touch locations and that are able to achieve large area coverage without linking multiple individual touch sensitive devices or individual touch surfaces together. In other words, the inventive touch sensitive system allows a substrate area to be touch sensitive without requiring touch surfaces to be produced by linking multiple touch screens or electronic devices together.

STATEMENTS OF INVENTION

In a first aspect of the invention, there is provided a touch sensitive system for a substrate such as a building, wall, floor, ceiling, door, cabinetry, furniture, vehicle or machine, the touch sensitive system comprising:
- at least one electrically active layer having at least one electrical property and configured to be applied to the substrate;
- an electronic controller; and
- wherein the electrically conductive active layer is configured to have an electrical connection with the electronic controller; and
- wherein a differentiated touch on the substrate disrupts the electrical property of the electrically active layer; and wherein the disruption is detected by the electronic controller to provide a control signal, and the differentiated touch is selected from: a single touch, one or more of multiple sequential touches, and/or one or more touches of extended duration.

In an aspect of the invention, there is provided a touch sensitive system for a substrate such as a building, wall, floor, ceiling, door, cabinetry, furniture, vehicle or machine, the touch sensitive system comprising:
  at least one electrically active layer having at least one electrical property and configured to be applied to the substrate;
  an electronic controller; and
  wherein the electrically conductive active layer is configured to have an electrical connection with the electronic controller; and
  wherein a differentiated touch on the substrate disrupts the electrical property of the electrically active layer; and wherein the disruption is detected by the electronic controller to provide a control signal, and the differentiated touch is selected from: one or more of multiple sequential touches, and/or one or more touches of extended duration.

In an aspect of the invention, there is provided a touch sensitive system for a substrate such as a building, wall, floor, ceiling, door, cabinetry, furniture, vehicle or machine, the touch sensitive system comprising:
  at least one electrically active layer having at least one electrical property and configured to be applied to the substrate;
  an electronic controller; and
  wherein the electrically conductive active layer is configured to have an electrical connection with the electronic controller; and
  wherein a differentiated touch on the substrate disrupts the electrical property of the electrically active layer; and wherein the disruption is detected by the electronic controller to provide a control signal, and the differentiated touch is selected from: a single touch.

In one aspect of the invention, there is provided a touch sensitive system for use with a substrate such as a building, wall, ceiling, floor, door, cabinetry, furniture, vehicle or machine, the touch sensitive system comprising:
  at least one electrically active layer having at least one electrical property and being configured to be applied to the substrate;
  an electronic controller configured to be electrically connected to the electrically active layer and to at least one electrical device which the system is configured to control;
  wherein the electronic controller is configured to receive a signal from the electrically active layer indicative of a change in the at least one electrical property of the electrically active layer when a differentiated touch is made to the electrically active layer by a user, the differentiated touch being selected from: a single touch, multiple sequential touches and/or a single touch of extended duration, and to subsequently control the at least one electrical device in dependence upon the signal.

In another aspect of the invention, there is provided a touch sensitive system for use with a substrate surface such as a building, wall, ceiling, floor, door, cabinetry, furniture, vehicle or machine, the system comprising:
  an electrically active layer configured to be applied to the substrate surface;
  optionally, an electrically inactive layer configured to be applied to the electrically active layer such that the electrically active layer is sandwiched between the substrate and the electrically inactive layer; and
  an electronic controller configured to be electrically connected to the electrically active layer and to at least one electrical device which the system is configured to control;
  wherein the electronic controller is configured to receive a signal from the electrically active layer, the signal being indicative of a change in at least one electrical property of the electrically active layer when a differentiated touch is made to the active layer by a user, the differentiated touch being selected from a single touch, multiple sequential touches and/or a single touch of extended duration, and to subsequently control the at least one electrical device in dependence upon the signal.

In another aspect of the invention, there is provided a touch sensitive system for use with a substrate surface such as a building, wall, ceiling, floor, door, cabinetry, furniture, vehicle or machine, the system comprising:
  an electrically active layer configured to be applied to the substrate surface;
  an electronic controller configured to be electrically connected to the electrically active layer and to at least one electrical device which the system is configured to control;
  wherein the electrically active layer is configured to comprise multiple connections to the electronic controller, each connection being associated with a different zone or region of the active layer;
  wherein the electronic controller is configured to receive a signal from the electrically active layer, the signal being indicative of a change in at least one electrical property of a particular zone or region of the electrically active layer when a differentiated touch is made to that particular zone or region of the active layer by a user, the differentiated touch being selected from a single touch, multiple sequential touches and/or a single touch of extended duration;
  the controller being further configured, to subsequently control the at least one electrical device in dependence upon the signal, the signal being indicative of the zone or region of the active layer in which the differentiated touch is made.

In another aspect of the invention, there is provided a substrate comprising: an electrically active layer applied to the substrate; wherein the electrically active layer is configured to have at least one electrical connection with an electronic controller; and
  wherein a differentiated touch on the large area substrate disrupts at least one electrical property of the electrically conductive active layer; and wherein the disruption is detected by the electronic controller to subsequently execute a command, the differentiated touch being multiple sequential touches, and/or one or more touches of extended duration, the command being dependent on the differential touch detected.

In another aspect of the invention there is provided an electronic controller configured for use with any of the touch sensitive systems of other aspects of the invention.

In another aspect of the invention there is provided a substrate to which an electrically active layer has been applied, for use with any of the touch sensitive systems of other aspects of the invention.

In another aspect of the invention there is provided an electrically active layer, in the form of a coating, configured to be applied to a substrate, for use with any of the touch sensitive systems of other aspects of the invention. In one embodiment the coating is a liquid coating configured to be applied to the substrate in liquid form. In another embodiment the coating comprises a sheet configured to be adhered to the substrate in sheet form.

In another aspect of the invention, there is provided a substrate comprising:
- an electrically active layer applied to the substrate; and
- an electronic controller configured to be electrically connected to the electrically active layer and to at least one electrical device that is controlled by the controller in dependence upon a change in the electrical properties of the electrically conductive layer which is detected by the controller.

In a further aspect there is provided an electronic controller configured to be electrically connected to an electrically active layer to control at least one electrical device, where the electrically active layer forms an electrically active layer on a substrate such as a building, wall, ceiling, floor, door, cabinetry, furniture, vehicle or machine;
- wherein the electronic controller is configured to receive a signal from the electrically active layer indicating a change in at least one electrical property of the electrically active layer when a differentiated touch is made to the layer by a user, the differentiated touch being selected from a single touch, multiple sequential touches and/or a single touch of extended duration, and to subsequently control at least one electrical device in dependence upon the signal.

In a further aspect there is provided an electronic controller configured to be electrically connected to an electrically active layer to control at least one electrical device, where the electrically active layer is configured to form a pattern on the substrate such that the active layer provides one or more electrically active regions on the substrate wherein the electronic controller is configured to receive a signal from the electrically active layer indicating a change in at least one electrical property of the electrically active layer when a differentiated touch is made to the layer by a user, the differentiated touch being a single touch, multiple sequential touches and/or a single touch of extended duration, and to subsequently control at least one electrical device in dependence upon the signal.

In a further aspect there is provided an electronic controller configured to be electrically connected to an electrically active layer to control at least one electrical device, where the electrically active layer is applied to a substrate such as a building, wall, ceiling, floor, door, cabinetry, furniture, vehicle or machine;
- wherein the electronic controller is configured to receive a signal from the electrically active layer indicating a change in at least one electrical property of the electrically active layer when a differentiated touch is made to the layer by a user, the differentiated touch being a single touch, multiple sequential touches and/or one or more touches of extended duration on different parts of the active layer, and to subsequently control at least one electrical device in dependence upon the signal.

In a further aspect there is provided an electronic controller configured to be electrically connected to an electrically active layer to control at least one electrical device, wherein the electrically active layer is applied to a substrate such as a building, wall, ceiling, floor, door, drawer, cupboard, cabinetry, furniture, vehicle or machine;
- wherein the electronic controller is configured to receive a signal from the electrically active layer indicating a change in at least one electrical property of the electrically active layer when a differentiated touch is made to the layer by a user, the differentiated touch being multiple sequential touches and/or one or more touches of extended duration are made on different parts of the active layer by the user, and to subsequently control two or more electrical devices in dependence upon the signal.

In further aspect of the invention, there is provided a touch sensitive system for a substrate such as a building, wall, floor, ceiling, door, cabinetry, furniture, vehicle or machine wherein the touch sensitive system comprises:
- an electrically conductive layer configured to be applied to the substrate; and
- an electronic controller;
- wherein the electrically conductive layer is configured to have an electrical connection with the electronic controller; and
- wherein a differentiated touch on the substrate disrupts conductivity in the electrically conductive layer; and wherein the disruption is detected by the electronic controller to execute a command, the differentiated touch being selected from: a single touch, multiple sequential touches, and/or one or more touches of extended duration.

In further aspect of the invention, there is provided a touch sensitive system for a substrate such as a building, wall, floor, ceiling, door, cabinetry or furniture wherein the touch sensitive system comprises:
- an electrically capacitive layer configured to be applied to the substrate; and
- an electronic controller;
- wherein the electrically capacitive layer is configured to have an electrical connection with the electronic controller; and
- wherein a differentiated touch on the substrate disrupts capacitance of the electrically capacitive layer; and wherein the disruption is detected by the electronic controller to execute a command, the differentiated touch being selected from: a single touch, multiple sequential touches, and/or one or more touches of extended duration.

In further aspect of the invention, there is provided a touch sensitive system for a substrate such as a building, wall, floor, ceiling, door, cabinetry, furniture, vehicle or machine wherein the touch sensitive system comprises:
- an electrically conductive layer with resistive properties configured to be applied to the substrate; and
- an electronic controller; and
- wherein the electrically conductive layer with resistive properties is configured to have an electrical connection with the electronic controller; and
- wherein a differentiated touch on the substrate disrupts resistance in the electrically conductive layer with resistive properties; and wherein the disruption is detected by the electronic controller to execute a command, the differentiated touch being selected from: a single touch, multiple sequential touches, and/or one or more touches of extended duration.

In further aspect of the invention, there is provided a touch sensitive system for a substrate such as a building, wall, floor, ceiling, door, cabinetry, furniture, vehicle or machine wherein the touch sensitive system comprises:
- an electrically inductive layer configured to be applied to the substrate; and
- an electronic controller; and
- wherein the electrically inductive layer is configured to have an electrical connection with the electronic controller; and wherein a differentiated touch on the substrate disrupts inductance in the electrically inductive layer; and wherein the disruption is detected by the electronic controller to execute a command, the differentiated touch being selected from: a single touch, multiple sequential touches, and/or one or more touches of extended duration.

Active Layer

In an embodiment, the touch sensitive system may comprise a plurality of electrically active layers. The active layers may be selected from one or two active layers. Alternatively, the active layers may be selected from one to three active layers. Alternatively, the active layers may be selected from one to four active layers. Alternatively, the active layers may be selected from one to five active layers. Alternatively, the active layers may be greater than five active layers. The active layers may be arranged in a sandwich or laminate with other layers. The other layers may be additional active layers, or electrically inactive layers.

In an embodiment of the invention, the active layer has the capability to conduct and/or retain an electrical charge after application to a substrate, sufficient to function as a sensor configured to detect disruption caused by the differentiated touch to an electrical field generated by the electrically active layer.

In an embodiment, the active layer may substantially cover the substrate surface. Alternatively, the active layer may partially cover the substrate surface. When the active layer partially covers the substrate surface, the active layer may comprise one or more active regions.

The one or more active regions may be arranged in any manner. Examples of possible arrangements of the one or more active regions may be selected from grid arrangements of the one or more active regions on the substrate surface; a quadrant arrangement of the one or more active regions on the substrate surface; a random arrangement of the one or more active regions on the substrate surface; and a sequential arrangement of one or of the one or more active regions on the substrate surface.

The active regions may be configured to provide a plurality of discrete active regions each or which, or one or more of which, when touched is configured to provide a different control function of a common electrical device, and/or to control a different electrical device, and/or to control the same electrical device but in a different way. A touch of each region may therefore generate a control signal which the controller is configured to be able to determine is particular to that region.

In an embodiment, the active layer comprises an active material. The active material is configured to provide the electrical property of the active layer.

Preferably, the electrical property of the active layer that is detected and used by the controller to generate a control signal, is selected from a capacitive property (capacitance), resistive property (resistance), resistive-capacitive property, or an inductive property of the active layer (induction). Those of skill in the art will readily understand that the active material may comprise, and indeed may inherently include, one or more electrical properties and the use primarily of one electrical property does not exclude use of one or more of the other electrical properties.

In an embodiment, the active layer may be selected from capacitive active layers, resistive active layers, conductive-resistive active layers, and inductive active layers.

In an embodiment, the active layer is a relatively thin layer, as compared to the thickness of the substrate to which the active layer is applied. Preferably, the active layer is less than 1 mm in thickness. More preferably, the active layer is less than 0.1 mm in thickness. Yet more preferably, the active layer is less than 0.06 mm (60 microns) in thickness.

In an embodiment, the active layer may be hidden, obscured or embedded under a dielectric or non-electrically active layer. Alternatively, the active layer may be hidden, obscured or embedded under one or more dielectric or non-electrically active layers.

Preferably, the active layer may be operated through the one or more dielectric layers, the one or more dielectric layers comprising dielectric material. Preferably, the dielectric material may be selected from: polymers, coatings, ceramics, cementitious materials, wood and wood composites, paper, cardboard, wallpaper, vinyl, laminates and glass.

The one or more dielectric layers may be of less than of 10 mm thickness. Preferably, the one or more dielectric layers may be of less than 4 mm thickness. More preferably the one or more dielectric layers may be of less than 1 mm thickness. More preferably, the one or more dielectric layers may be of less than 250 microns thickness.

In another embodiment, the one or more dielectric layers may provide aesthetic features to emphasise the location of the active layer on the substrate.

In an embodiment, the active layer may be: left exposed so that a user touches the active layer directly, covered with a topcoat layer, a coating material, or applied on top of one or more base or undercoat layers.

Preferably, the active layer is covered with a topcoat layer when the active layer is not aesthetically pleasing, that is, to improve or disguise the appearance of the active layer.

In an embodiment, the active layer may comprise an aesthetic feature to emphasise the location of touch sensitive locations.

Aesthetic features may be selected from colours, textures, logos, branding or any combination of the aforementioned.

The active layer may be a coating that is applied to the substrate in liquid form. The coating may be selected from: a paint, a lacquer, and a gel for example. Preferably, the coating is a paint. Preferably, the coating dries to solidify on the substrate. Preferably, the coating is a waterborne coating.

In an embodiment, the active layer is a dispersion comprising active material particles dispersed within a dispersing medium. Preferably, the dispersion is a coating material. Preferably, the dispersion is an aqueous dispersion. Preferably, the dispersing medium provides sufficient contact between the active material particles to retain the electrical property when the active layer is applied to a substrate. Preferably, the dispersing medium provides sufficient contact between the active material particles to retain the electrical property when the active layer is applied to a substrate and the active layer dries on the substrate.

The dispersing medium may be a polymeric material capable of film formation. Preferably, the film is formed under ambient conditions.

Polymeric materials capable of film formation may be selected from, but not limited solely to: acrylic copolymers; polyurethanes; epoxies; hydrocarbon polymers; modified hydrocarbon polymers; polycarbonates; polyesters, including natural oil derived polymers such as alkyds; silicone polymers; mixtures and hybrid polymers of the aforementioned. These and many other polymers suitable for film formation are commonly known to those skilled in the art.

Polymeric materials capable of film formation may also be selected from polymers that are formed in-situ from monomeric precursors. These and many other polymers are known to those skilled in the art.

Polymers or polymeric precursors capable of film formation may be used without a solvent, or without dissolution or dispersion in a suitable solvent. Suitable solvents for use in the film forming component of the active layer include: water; acrylic dispersions and solutions; styrene-acrylic dispersions and solutions; and organic solvents or a combination of the aforementioned.

In an embodiment, the active layer may optionally comprise one or more agents selected from: dispersing agents, rheology modifiers, extender pigments, biocides, defoamers, surfactants, processing aids, film forming aids and co-solvents.

Preferably when the active layer is a coating material, the coating material comprises dispersing agents, rheology modifiers, extender pigments, biocides, defoamers, surfactants, processing aids, film forming aids and co-solvents. Preferred coatings are waterborne coatings. Preferably, the waterborne coatings have low impact on local environments and allow easy clean-up.

Active Materials

In an embodiment of the invention, the active material has the capability to provide an electrical property after application to a substrate, sufficient to function as a sensor configured to detect disruption caused by the differentiated touch to the electrical property provided by the active material.

Preferably, the active material is present in the active layer in the range of from about 1% w/w to about 30% w/w of the active layer.

Preferably, the active material is present in the active layer in the range of from about 5% w/w to about 25% w/w of the active layer.

Preferably, the active material that is present in the active layer in the range of from about 10% w/w to about 20% w/w of the active layer.

In an embodiment, the active material may comprise any conductive or conductive-resistive material or combination of materials to produce the electrical property of the active layer a change or disruption to which is detected by the controller. Those of skill in the art will readily understand that the active material will comprise a number of electrical properties and the active layer may be selected to particularly exhibit or enhance one or more of those electrical properties. Those of skill in the art will also realise that stability, particularly to surface oxidation when metallic materials are utilised, is an important feature in order for conductivity to be retained for an extended period of time.

In an embodiment of the invention, the active material may be selected from: carbon; metals; metal coated materials; and metal oxides, or a combination thereof. Preferably, the active material comprises carbon.

The active material may be in the form of particles. Preferably, active material particles are selected from one or more of: powders, flakes, plates, platelets, fibres, micro-particles, nano-particles, micro-fibres, nano-fibres, and nano-tubes, or a combination thereof.

In an embodiment of the invention, the active material may be selected from one or more of carbon in the form of flakes, powders, fibres, nano-fibres, nano-tubes, nano-particles. Carbon may be selected from, but not limited solely to, graphene, graphite, carbon black, and lamp black. Examples of suitable carbon materials are CARBOBYK-9810, which is a water-borne carbon nanotube dispersion for enhancing mechanical properties, is capable of electrical conductivity and antistatic behaviour, and supplied by BYK Additives & Instruments. Other suitable carbon materials may be XPB 545 and Printex XE2-B that are conductive carbon black pigments supplied by Orion Engineered Carbons.

In an embodiment of the invention, active materials may be selected from metals and alloys in the form of flakes, powders, plates, platelets, particles, micro-particles, nano-particles, nano-rods, fibres, micro-fibres, nano-fibres. Metals may be selected from, but not limited solely to copper, silver, copper coated with silver, aluminium, nickel, chromium, zinc, palladium, gold, platinum, cadmium and tin. Examples of useful stable metallic materials include, but are not limited solely to, eConduct Copper 122000, eConduct Copper 420500 and eConduct Copper 421000 all supplied by Eckart Effect Pigments, which are fine copper powders coated with silver. Metal capacitive materials may also include, but are not limited solely to, metal doors, metal door handles, metallic cladding, and metallic roofing material.

In an embodiment of the invention, active materials may be selected from metal coated materials in the form of powders, flakes, fibres, microparticles, nano-particles, fibres, nano-fibres, and nano-tubes. Metal coated materials may be selected from, but not limited solely to, silvered conductive inorganic powders, gold coated powders, nickel coated powders and copper coated powders. Specific examples of useful materials include, but are not limited solely to silver coated micro-fibres of typical dimensions 14×50 microns and volume resistivity of 2 mΩ·cm such as CE55 from Shepherd Technologies; silver coated microplatelets of typical dimensions 1×10×10 microns and volume resistivity of 1 mΩ·cm such as PL10 from Shepherd Technologies; silver coated microspheres of typical diameter 15 microns and volume resistivity of 1 mΩ·cm such as MS15 from Shepherd Technologies; silver coated PMMA particles with diameters in the range of 5-125 microns available from Coshperic; gold coated to about 20 nm thickness on barium titanate glass microspheres with typical diameters in the range 30-100 um available from Cospheric; nickel coated hollow glass microspheres of average 17 micron diameter from Cospheric; and resin particles coated with double layers of nickel-gold such as BRIGHT GNR-EH from Nippon Chemical Industrial Co.

In an embodiment of the invention active materials may be selected from metal oxides including indium and antimony tin oxides, other doped tin oxides, doped zinc oxides, doped cadmium oxides, silver oxides and titanates. Examples of applicable metal oxides include, but are not limited solely to, electro-conductive powders supplied by Zelec such as antimony doped tin oxide; and VP ITO grades from Evonik.

In an embodiment of the invention, the active materials may be conductive polymers that may be selected from polyanilines; polyacetylenes; polypyrroles; polythiophenes; modified polystyrenes and their combinations; and derivatives and/or any combination of the aforementioned. Examples of conductive polymers include, but are not limited to, Poly(3,4-ethylenedioxythiophene)-poly(styrene-sulfonate) such as Clevios FAS8 supplied by Heraeus; and Poly(3,4-ethylenedioxythiophene)-poly(styrenesulfonate) such as Clevios PH 1000 supplied by Heraeus.

In an embodiment of the invention, active material is present at a level exceeding the percolation threshold for the particular active layer where the percolation threshold denotes the lower limit of conductivity for a particular active material in an active layer.

In an embodiment, the active material may provide the electrical property of resistance. The active material providing the electronic property of resistance must have a resistance that is greater than the resistance of a metal or metal alloy. Suitable resistive materials are known to those of skill in the art.

Additional Electrically Conductive Layers

In an embodiment of the invention, one or more additional electrically active layers may be used in conjunction with the active layer.

In an embodiment, the one or more additional electrically active layers have higher electrical property than the active layer.

In an embodiment, the one or more additional electrically conductive layers may have an area less than, or equal to the area of the active layer. Preferably the one or more additional electrically conductive layers has an area less than 100% of the area of the active layer. More preferably, the one or more additional electrically conductive layers has an area less than 80% of the area of the active layer. Yet more preferably, the one or more additional electrically conductive layers has an area less than 75% of the area of the active layer. Yet more preferably, the one or more additional electrically conductive layers has an area less than 50% of the area of active layer. Yet more preferably, the one or more additional electrically conductive layers has an area less than 20% of the area of the active layer. Yet more preferably, the one or more additional electrically conductive layers has an area less than 15% of the area of the active layer. Yet more preferably, the one or more additional electrically conductive layers has an area less than 10% of the area of active layer. Yet more preferably, the one or more additional electrically conductive layers has an area less than 5% of the area of active layer. Yet more preferably, the one or more additional electrically conductive layers has an area between 1-5% of the area of active layer.

Preferably, when the additional electrically conductive layer is less than the area of the active layer, the one or more additional electrically conductive layers has at least one region arranged to have a conductive area.

In an embodiment, the one or more additional electrically conductive layers may comprise metals or comprise metallic materials as conductive elements. Metals or metallic materials may be selected from a metal sheet, foil or strip, a metal-filled polymer, and a metal-containing coating.

Preferably, the metals as conductive elements of the one or more additional electrically conductive layers may be selected from copper silver, copper coated with silver, aluminium, nickel, chromium, zinc, palladium, gold, platinum, cadmium and tin.

Preferably, the metallic material as conductive elements of the one or more additional electrically conductive layers may be selected from silvered conductive inorganic powders, gold coated powders, nickel coated powders and copper coated powders.

In an embodiment, the region of the additional electrically conductive layer is arranged to have a conductive area that may be selected from: a metallic strip, and a metallic coating material containing metallic pigments. The region configured to have a conductive area may be adhered to a dielectric material. Alternatively, the region configured to have a conductive area may be adhered to the active layer by a conductive adhesive. Preferably, the conductive adhesive is a self-adhesive material. Conductive adhesives include metal and carbon-filled adhesives. Specific examples are silver Conductive Epoxy with a 4 hour working time and 0.0007 Ω·cm resistivity such as 8330S from MG Chemicals.

Self-adhesive materials include, but are not limited solely to woven, non-woven and foam tapes; double or single sided with X, XY or XYZ conductivity and metal foil tapes. Specific examples include XYZ conductive acrylic on conductive woven backing with 0.2 Ohm/square surface resistance such as Tesa 60253, supplied by Tesa; and copper EMI Shielding Tape of 0.1 mm thickness such as 1245 Tape, from 3M.

Preferably, the metallic strip is selected from: metal wires, metal channels, metal strips, metal foils, and strips of sheet metal.

Preferably, the metallic coating material containing metallic pigments is selected from copper, silver, copper coated with silver, aluminium, nickel, chromium, zinc, palladium, gold, platinum, cadmium, tin, silvered conductive inorganic powders, gold coated powders, nickel coated powders and copper coated powders.

Layout of Additional Electrically Conductive Layers

In an embodiment, the one or more additional electrically conductive layers may be applied on top of the active layer, on the periphery (edges) of the active layer, or under the active layer.

In an embodiment, where the additional electrically conductive layer is less than the area of the active layer as described above, there may be more than one additional electrically conductive layer.

In an embodiment, the one or more additional electrically conductive layers may be arranged in a parallel orientation, a grid orientation or a loop orientation.

In an embodiment, the one or more additional electrically conductive layers may be a connecting means configured to form a connection to the electrically active layer, or to other additional electrically conductive layers.

Topcoat Layers

In an embodiment, the active layer may be coated with one or more topcoat layers. Those of skill in the art will realise that the topcoat layer does not need to be applied directly to the active layer. Where additional conductive layers are on top of the active layer, the topcoat may be applied to the uppermost layer.

A topcoat layer may be preferable where the active layer is limited in colour range or where the active layer is not transparent. The topcoat layer may provide a more aesthetically pleasing colour or feature. For example, when the active layer is a coating material and comprises carbon black as the conductive or conductive-resistive material that acts as a capacitor, it may be desirable to hide the active layer from view and provide a more aesthetically pleasing colour or feature. The topcoat layer may provide or comprise an aesthetic feature. The topcoat layer may be a decorative coating. Aesthetic features may be selected from glosses, textures, patterns and colour variations.

Alternatively, a transparent topcoat layer, a semi-transparent topcoat layer or an opaque topcoat layer may be applied over any active layer. Semi-transparent or opaque topcoat layers may be selected from, but not limited solely to another coating, laminates, wallpapers or films.

Preferably, the active layer is insoluble or has limited solubility in the topcoat layer.

Base Layers

In an embodiment, the active layer may be applied on top of one or more base layers. Preferably, the base layers may be selected from, but are not limited solely to, sealers and primers.

Substrate Surface

In an embodiment of the invention, the active layer may be applied to a substrate surface. The active layer may in some embodiments be configured to be applied to a substrate of any size, with no upper limit on the size of substrate. For example, if the active layer is in liquid coating form, the coating may be applied onto the substrate in whatever quantity is required to cover or pattern the substrate, and without any necessity to have smaller substrates which need to be connected together to achieve the surface area required. Thus, walls of buildings may be entirely covered or patterned in the active layer.

The active layer may be suitable for application to a substrate having a surface area of at least about 0.05 m$^2$, 0.5 m$^2$, 1 m$^2$, or 10 m$^2$, 100 m$^2$, or larger as required; provided that the substrate surface is not an electronic device such as: handheld devices such as phones, tablets; laptops; televisions; computer monitors; and those types of devices intended to display electronic text and/or electronic images. The substrate is therefore preferably a passive, non-electrically active, substrate with no display characteristics.

Any substrate may be covered with an active layer including uneven surfaces, textured surfaces, patterned surfaces, rounded or spherical surfaces, surfaces with cut-outs, hard surfaces, soft surfaces, metallic surfaces, glass surfaces, wood, engineered wood, wood composites, paper surfaces, plastic surfaces and corners of any angle.

Substrates may be selected from interior walls; exterior walls; windows, interior or exterior; floors, ceilings; furniture, tables, cabinets, cupboards, drawers, shelving; doors; fences; decks; roofs; roads, pathways and/or driveways, vehicles and machines. The substrates are not limited to flat surfaces such as the aforementioned and could be curved or arcuate for example.

More preferably, the substrate surfaces have an area greater than 1 m$^2$. Alternatively, the substrate surfaces have an area greater than 1 m$^2$. Alternatively, the substrate surfaces have an area greater than 5 m$^2$. Alternatively, the substrate surfaces have an area greater than 10 m$^2$.

In an embodiment, the substrate surface includes corners or joins in the area substrate; for example, the corners in walls, buildings or fences.

In a further embodiment, the active layer may be applied to sheets and/or films of materials. Such sheets and films may be selected from, but are not limited solely to: wood; engineered wood; wood composites; plasterboard; cement; plastic; adhesive materials including, but not limited solely to wallpaper, vinyl laminating film; and glass sheets.

Means to Apply the Active Layer

The active layer may be applied by any means suitable for the substrate and may be selected from, but not limited solely to: spray atomization; manual mechanical means; adhesive and self-adhesive means, printing methods may also be used for reduced viscosity formulations and for automated processes.

Preferably, the active layer may be applied by any means suitable for the substrate and, when applied as a liquid coating, may be selected from, but not limited solely to: spray atomization including airless spray, low volume/low pressure spray (LVLP), and pressure pots; manual mechanical means including, but not limited solely to, roller sleeves and brushes; printing methods may also be used for reduced viscosity formulations and for automated processes.

Electronic Controller Connecting with the Active Layer

In an embodiment, the active layer is connected to the electronic controller by one or more connecting means which provide the means for communication between the active layer and the electronic controller. The connecting means may comprise or be selected from one, or more than one, connection point.

In an embodiment, the connecting means may be a physical connecting means, or a remote connecting means.

In an embodiment, the connecting means may be the additional electrically conductive layer as described above.

In an embodiment, the physical connecting means may be selected from electrically conductive adhesive, electrically conductive tapes, conductive wires, mechanical contact, screws, screw plates, bolts, the additional electrically conductive layers, and any combination of the aforementioned In an embodiment, the remote connecting means may include wireless connectivity.

In an embodiment, the wireless connectivity may be selected from any one or more of: transmitters, receivers, transceivers, Wi-Fi and Bluetooth.

In an embodiment, the connecting means may further comprise an intermediate connector. Preferably, the intermediate connector is arranged between the active layer and the electronic controller.

In an embodiment, the intermediate connector may comprise an electrically conductive area. An electrically conductive area may be selected from: metallic plates; and/or connector parts selected from switches, plugs and sockets.

In an embodiment, the intermediate connector may be adhered to the active layer by a suitable means provided that electrical conductivity is maintained. Suitable adhering means may be selected from but not limited to: electrically conductive adhesive, electrically conductive tapes, conductive wires, mechanical contact, screws, screw plates, bolts, the additional electrically conductive layers, and any combination of the aforementioned When the active layer is a coating material, the connecting means may be formed by application of the active layer over an intermediate connector. Preferably, the connection between the active layer to the electronic controller is via an intermediate connector. In an embodiment, the connecting means may connect the active layer to a device or a network.

The active layer may comprise more than one connection such that more than one part or region of the active layer is connected to the controller. The controller may be configured to generate a control signal for controlling an electric device in dependence upon a comparison between signals received via different connections.

Differentiated Touch

The differentiated touch is a touch that is recognised by a controller as generating a control signal to actively control an electrical device. A differential touch is intended to mean a touching event intended to disrupt the electric property of the active layer whereby the disruption generates a command that is executed by a controller. Those of skill in the art will readily understand that the active layer does not need to be touched directly and the electric property may be disrupted through additional layers on top of the active layer. An intentional touch does not inadvertently or accidentally cause a command to be executed. In other words, the controller is configured, by suitable control algorithms which may be implemented in hardware or software or via control signals generated by a remote or cloud server to process the detailed characteristics of the signal(s) generated. The signal(s) generated are indicative of the disruption to the electric property and the controller determines accordingly whether that disruption is from an intentional or accidental touch event on the active layer.

In an embodiment, the differentiated touch may be a single touch event. Alternatively, the differentiated touch event comprises multiple touch events and/or continuous touch events of an extended duration. The length of time considered to be an extended duration may be pre-programmed on the controller, or may be actively calculated by suitable algorithms on the controller, or may be able to be adjusted using the controller, for example by the user. The length of time considered to be an extended duration may be determined to vary in dependence upon the type of appliance being controlled.

In an embodiment, the differentiated touch may be selected from multiple touch events, a continuous touch event of an extended duration, or a combination of multiple touch events and continuous touch events.

Preferably, when the differentiated touch event is a multiple touch event, the differentiated touch events are multiple taps. Multiple taps may be selected from any one or more of: two taps, three taps, four taps, and five taps, and more than five taps. Preferably, multiple taps are selected from two taps and three taps. One or more taps may be of different duration from one or more other taps. Each tap may be defined electronically as a short pulse or step change in the electric property.

Preferably, when the differentiated touch event is a continuous touch event, the differentiated touch events are selected from: swipe events and hold events.

Preferably, swipe events comprise maintaining contact between an object that disrupts the electric property and the active layer, as the object is moved along an elongate path on the substrate surface to disrupt the electrical property of the active layer. The swipe event may allow the controller to function as a slider which would be readily known to those of skill in the art to vary a control signal within a predetermined range, for example to adjust the temperature of a heating device, or to adjust the duration of operation of an electrical device. Preferably, hold events comprise maintaining contact between an object and the substrate surface, over a predetermined time. Preferably, the predetermined time may be from about 100 ms to about 5 sec. Preferably, the predetermined time may be from about 200 ms to about 3 sec. More preferably, the predetermined time may be from about 300 ms to about 2 sec. Most preferably, the predetermined time may be from about 500 ms to 1 sec.

In an embodiment, when the differentiated touch event is a combination of multiple touch events and continuous touch events, the multiple touch events may be selected from: a combination of a single tap event (one tap) and a continuous touch event; multiple continuous touch events, or alternatively, a combination of multiple taps and one or more continuous touch event. For example a combination of multiple touch events and continuous touch events may be selected from a single tap and a swipe, or multiple taps and a swipe; or alternatively, a single tap and hold, or multiple taps and a hold on the substrate surface that comprises the active layer.

The differentiated touch may be single touch that is applied to different active regions of the substrate. For example, the active layer may be configured on the substrate to provide multiple discrete active regions, each of which comprises a respective connection to the controller. The controller may be configured to be able to detect which particular region is being touched, and to generate a control signal dependent on that particular region. Different regions may produce different control signals when touched.

Objects to Disrupt the Electric Property of the Active Layer.

In an embodiment, any object having an electrical property sufficient to disrupt the electrical property of the active layer may be used to disrupt the electrical property of the active layer.

In an embodiment, objects that may be used to disrupt the electrical property of the active layer include body parts: the head or parts of the head, shoulders, arms, elbows, hands or parts thereof, hips, legs; knees, feet or parts thereof. Alternatively, the electrical property may also be disrupted by an animal, for example a service or assistance animal such as a guide dog. Alternatively any object unconnected with a body or animal may be used to disrupt the electrical property of the active layer. In an example, the object has its own electric field or capacitance or the object is polarisable in the electric field produced by the active layer.

Applications/Uses

In an embodiment, touch sensitive coating for a substrate may be used for executing a command to switch an electrical capacitance on or off.

In an embodiment, the touch sensitive system for a substrate may be used in the fields selected from: safety monitoring applications, security monitoring applications, energy conservation, commercial applications, industrial applications, retail and service applications, domestic applications, entertainment applications, home décor, roading, parking, vehicular, and machinery applications.

In an embodiment, the touch sensitive system may be used in the field of safety monitoring. Preferably, an application in the field of safety monitoring includes having contact areas, namely substrates to which the active layer is applied; for example in care institutions; residential care facilities such as retirement villages; medical facilities; a person's home and industrial sites. The disruption to the electrical property within the active layer may cause a controller to execute an alarm command for example, if a patient fell into, or otherwise touched the active layer applied to a substrate.

The system could be applied to detect the presence or absence of a person on a floor. Alternatively, the touch sensitive system could be activated by a service animal. For example, in situations where the elderly, frail or the infirm are likely to fall and injure themselves, or during an adverse health event such as a seizure or a collapse.

In an embodiment, the touch sensitive system may be used in the field of security monitoring. The system may be used to detect persons or intruders in restricted areas or areas with controlled access. The disruption to the electrical property within the active layer may cause a controller to execute an alarm command or a warning system. The alarm or warning signal could be sent to a remote server or other electronic device to provide a remote alarm to a monitoring station or party. Such touch systems could be used in the justice system, for example in prisons and holding cells to detect occupancy or vacancy, for example, to detect footfalls on a substrate surface. Alternatively, the touch sensitive system could be applied to security in art galleries or museums, banks, building societies, government buildings, defence bases and airports and places that often have controlled or heightened security restrictions, for example, to detect footfalls on a substrate surface.

In another embodiment, the touch sensitive system may be used to conserve energy. For example, the system could be used to detect movement in commercial buildings. Uses include the notification of a party or person at a reception desk; automatic lighting on entering or exiting a room. Alternatively, the touch system could be a replacement for an exit button on controlled access doors.

In a further embodiment, the touch system may also find use in a retail or hospitality environment such as a shop, café or hotel. The use may include: the automation of shop doors that detect a person(s) entering or leaving premises.

In a further embodiment, the touch system may find use in entertainment systems. For example, entertainment systems may include children's play, such as a toy or educational system which generates light and sound responses to touch; educational displays, such as at museums.

In a further embodiment, the touch system of the present invention may find use in domestic applications. For example, switching on/off of electrical appliances. Suitable electrical appliances may include: lighting, such as bedside lamps, ceiling lighting, outdoor lighting; televisions; computer systems; heating systems including underfloor heating, central heating systems, heat transfer systems; cooling systems such as air conditioning systems; ventilation systems including fans, ducting that allow transfer of air from one location to another; automatic opening doors including garage doors, doors to premises such as shop doors. The touch system of the present invention may find use in wet areas allowing for removal of any mechanical devices from a wet area and provide improved safety from electric shock.

In a further embodiment, the touch system of the present invention may find use in industrial applications. For example, high ingress protection ratings may be obtained by locating any mechanical components of the system in a remote location which provides for intrinsically safe switching in areas where flammable materials are stored or used.

In a further embodiment, the touch system of the present invention may find use in roading and parking applications. For example, the system could be applied to a road surface to detect when a vehicle is stopped at a junction/intersection to facilitate effective traffic management, provided that the vehicle has an electrical property sufficient to disrupt the electrical property of the active layer. The system could also be applied to vehicle parking spaces to detect the presence or absence of a vehicle in that space.

In a further embodiment, the touch system of the present invention may find use in vehicular applications. For example, the system could be applied in marine craft where switching devices such as winches or lights from any point on a boat's hull or interior provides increased utility.

In a further embodiment, the touch system of the present invention may find use in machinery applications. For example, the system could be applied to large machines such as engines, generators, cutting machines and the like to provide a safety switch accessible from more locations than achievable with conventional switches.

The system may be used to control any electronic device which requires a control signal to function. Such devices may be as simple as one or more light bulbs, through to one or more computers or microprocessors.

Figure 1:
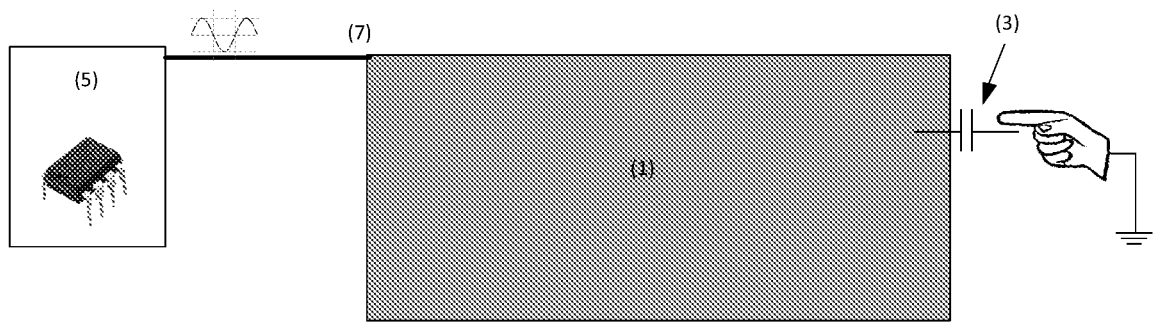
FIG. 1 A) Shows a single ended capacitive sensing touch system where capacitance is created by a differentiated touch event (3) on the active layer (1). Any change in capacitance travels through the node (7) to the electronic controller (5).
Figure 1:
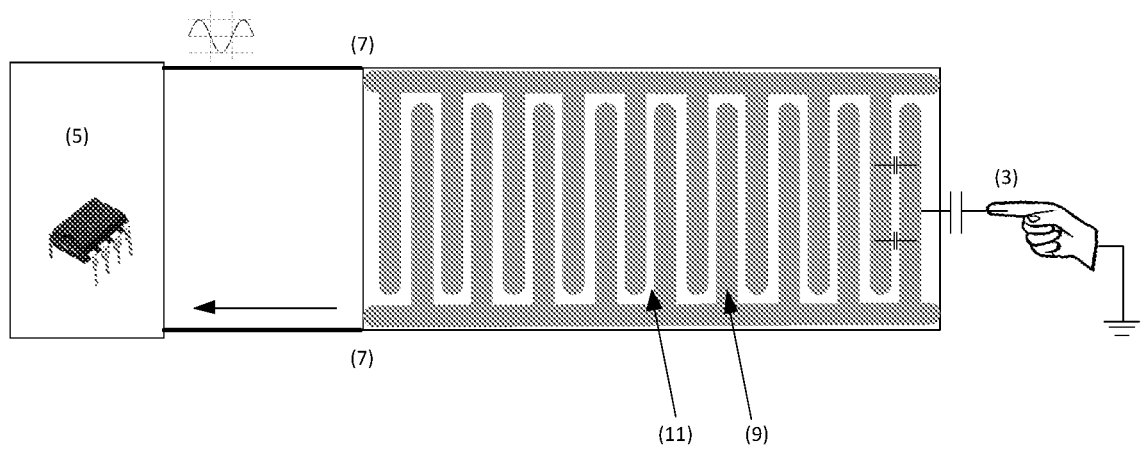

B) Shows a differential capacitive sensing touch system where capacitance from a differentiated touch event (3) reduces capacitance. The active layer is arranged in a pattern (9) on the substrate surface (11). Any change in capacitance travels through the patterned active layer (9), the connecting means (7) to the electronic controller (5) to execute a command.

Figure 2:
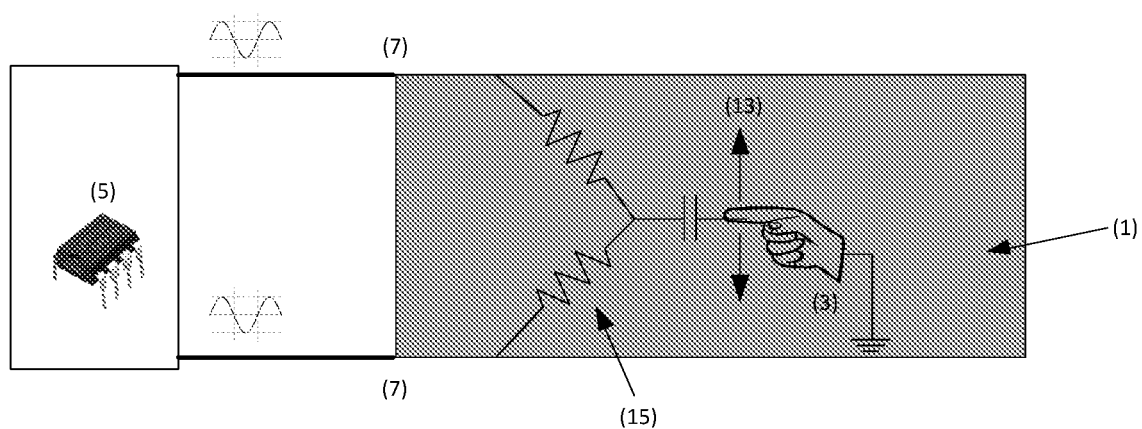

FIG. 2 Shows a resistive capacitive swipe touch system where the active layer (1) is a conductive resistive active layer. The touch event (3) in a vertical axis (13) provides a series of resistances (15), which travel through node (7) to the electronic controller (5).

Figure 3:
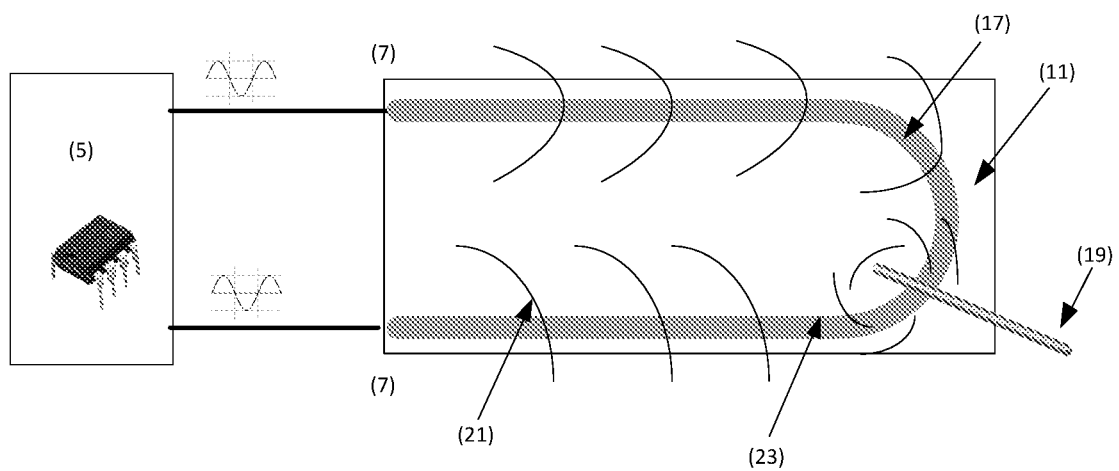

FIG. 3 Shows an inductive touch system. The active layer (1) is arranged as a loop (17) on the substrate surface (11) creating a magnetic field (21). Objects with magnetic permeability (19) disrupt the magnetic field (23) resulting in changes in inductance, which are transferred via the connecting means (7) to the controller (5).

Figure 4:
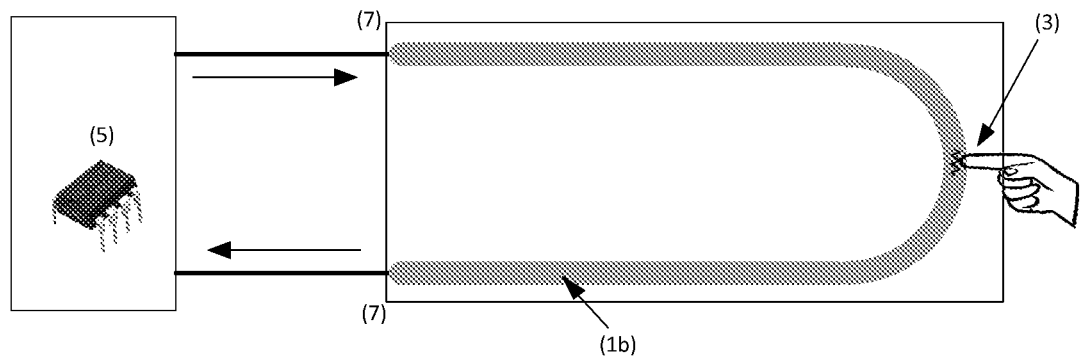

FIG. 4 Shows a closed circuit resistive system. A resistive active layer (1b) is arranged in a loop. A differentiated touch (3) changes the resistance of the resistance layer (1b).

Figure 5:
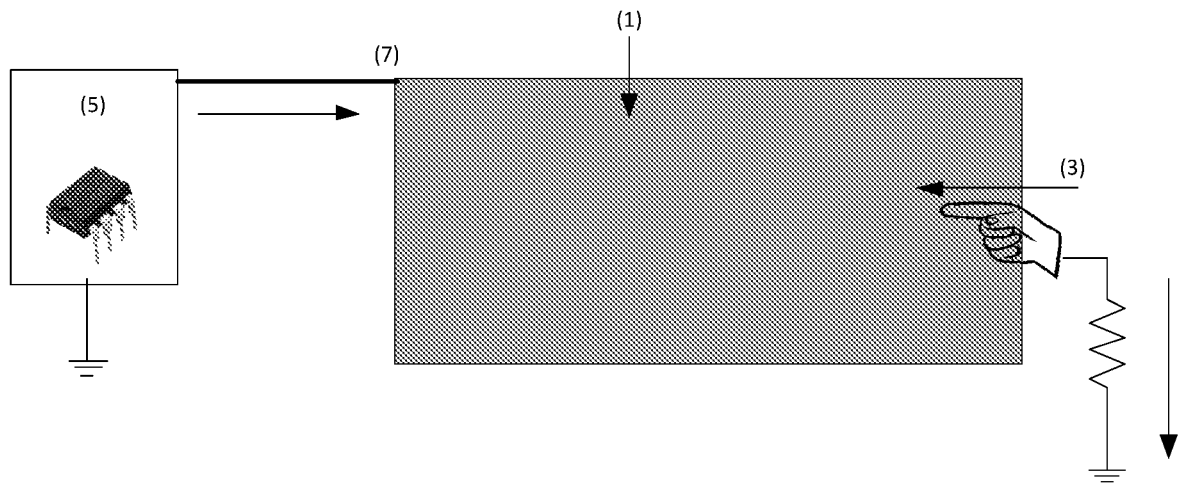

FIG. 5 Shows an open circuit resistive sensing touch system. When the circuit is open, no current flows. A differentiated touch (3) by an object draws a current through the object thereby completing the electronic circuit. The current can and measured by the electronic controller and used to issue a command.

Figure 6:
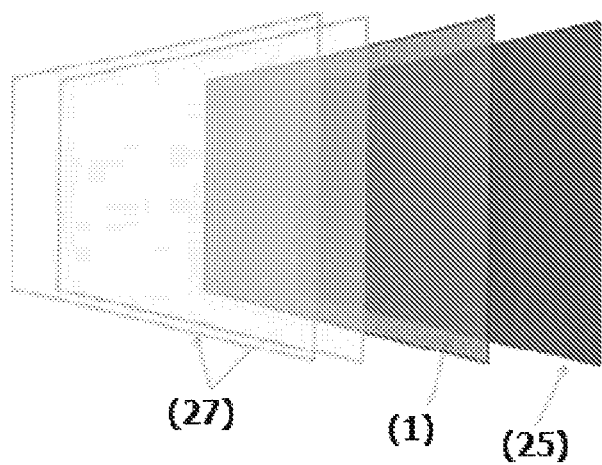

FIG. 6 Shows a possible arrangement of the active layer (1) with other layers to form a basic capacitive resistive coating in a sandwich type arrangement.

Figure 7:
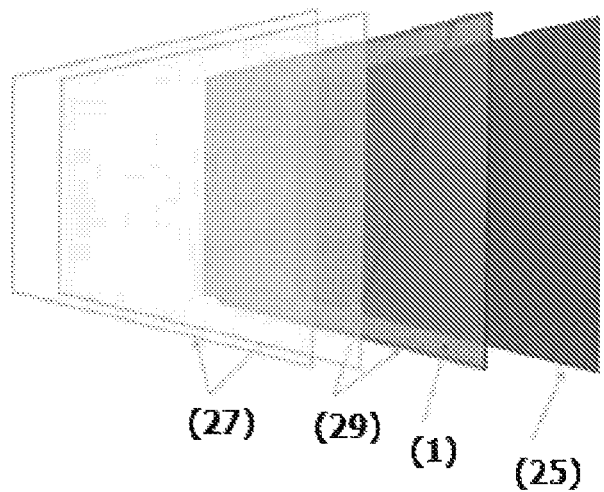

FIG. 7 Shows a possible arrangement of the active layer (1) with additional electrically active layers (45) as an enhanced conductive resistive coating basic capacitive resistive coating.

Figure 8:
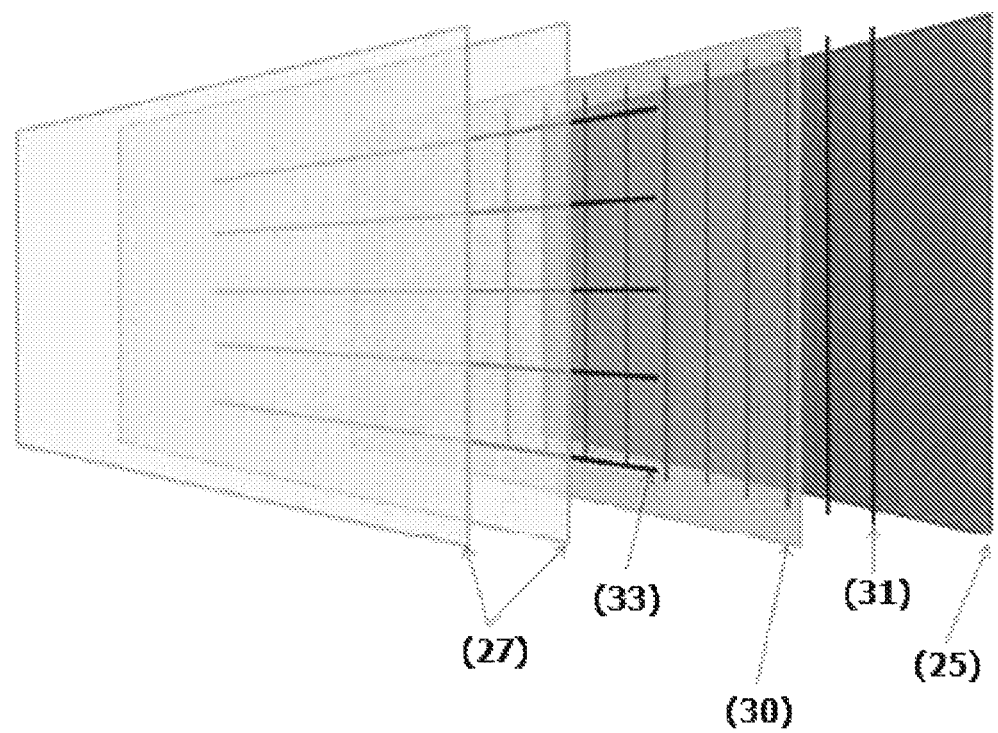

FIG. 8 Shows a possible arrangement of the active layer (1) to form a capacitive resistive grid coating (31) and (33).

Figure 9:
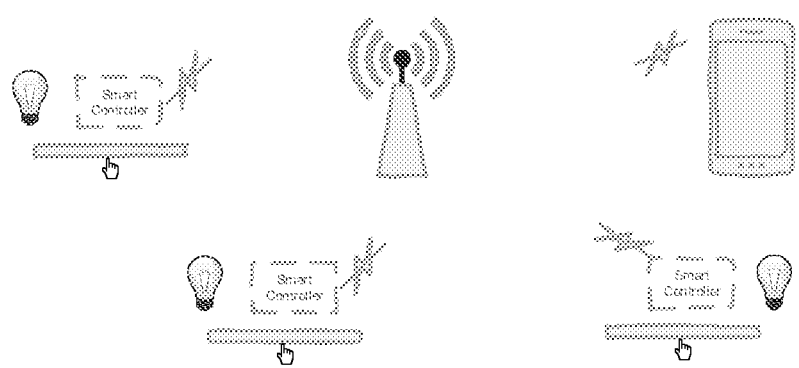

FIG. 9 Shows a possible combination of active layer (1) and electronic controller (5) systems wireless connected and interacting with other such systems. A computer or other Smart Phone or Tablet device may be used to remotely connect to any of these systems, and monitor and/or configure their behaviour.

Figure 10:
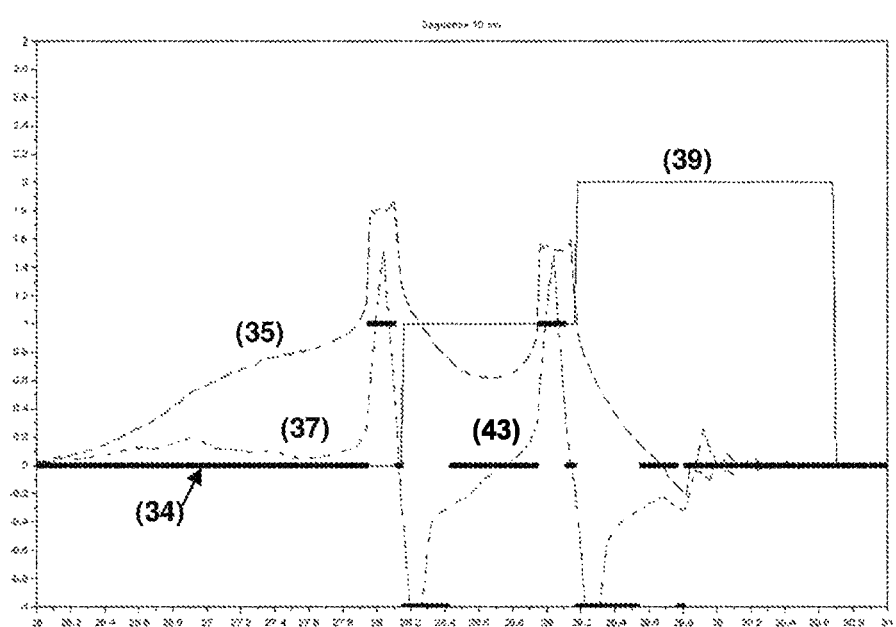

FIG. 10 Shows a touch detection algorithm during a double tap touch event.

Figure 11:
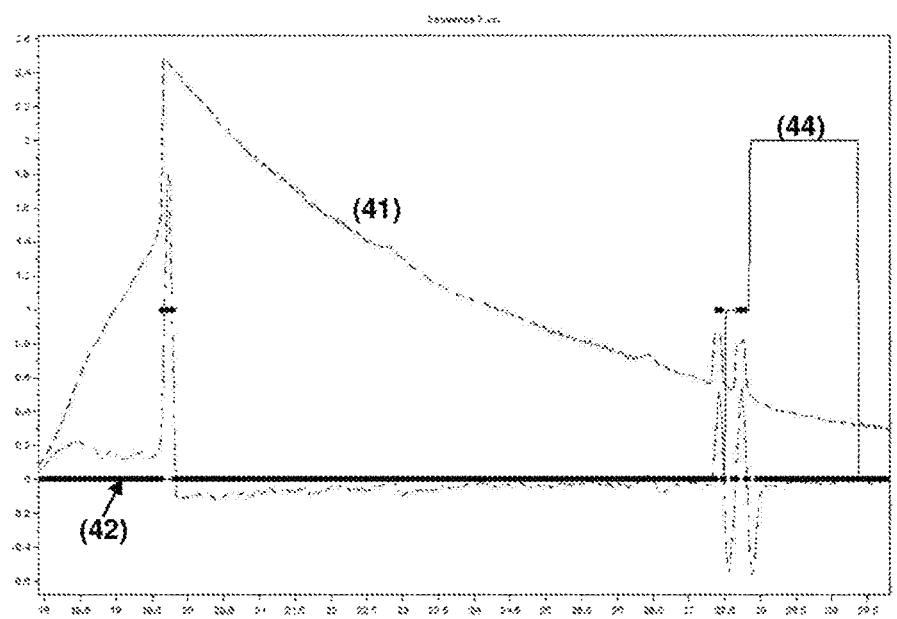

FIG. 11 shows a touch detection algorithm during a full hand touch followed by a double tap touch event.

Figure 12:
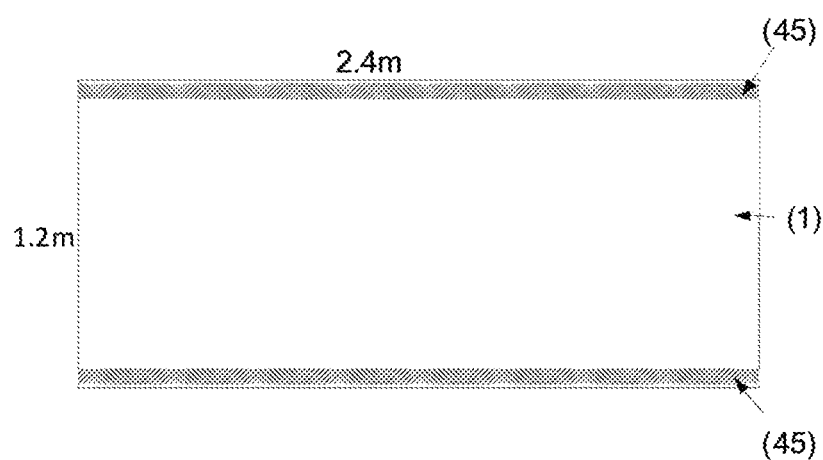

FIG. 12 Shows a system with additional electrically conductive layers in the form of two strips. The active layer (1) comprises carbon paint and the additional electrical conductive layers (45) are strips of copper paint along the top and bottom of the area substrate.

Figure 13:
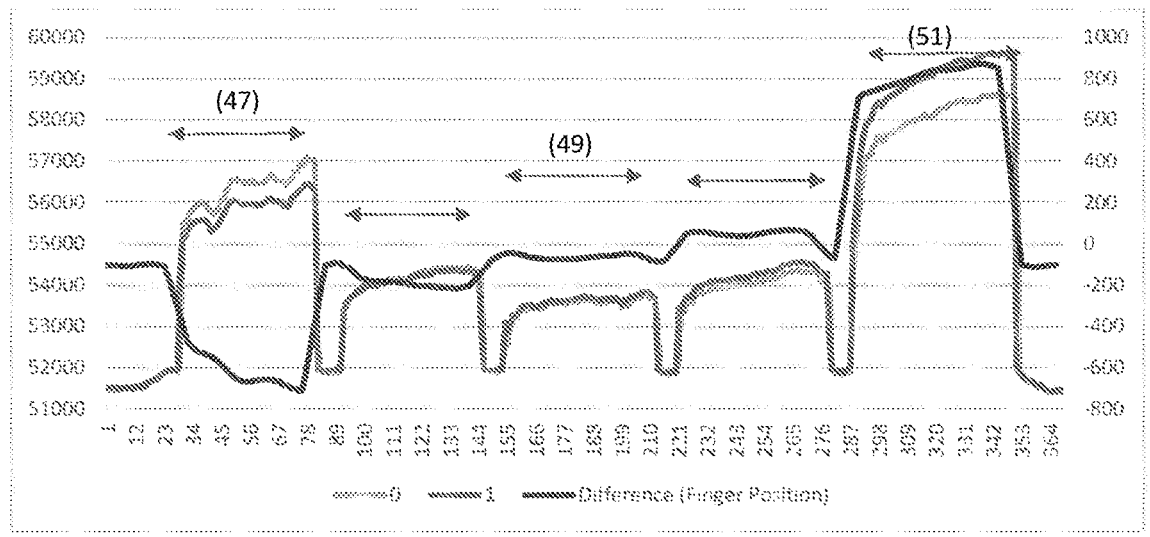

FIG. 13 Shows swipe touch events on the active layer at different positions with respect to two oppositely placed additional conductive layers. (47) Is a touch nearer the bottom if the additional electrically active layer (45); (49) is a touch equidistant between two additional electrically active layers (45); and (51) is a touch close to the top of an additional electrically active layer (45).

Figure 14:
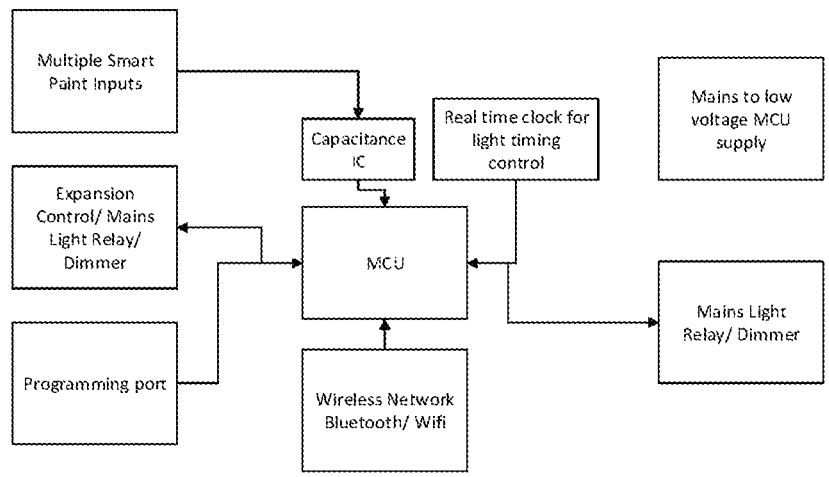

FIG. 14 Shows a possible arrangement of electronic components.

Figure 15:
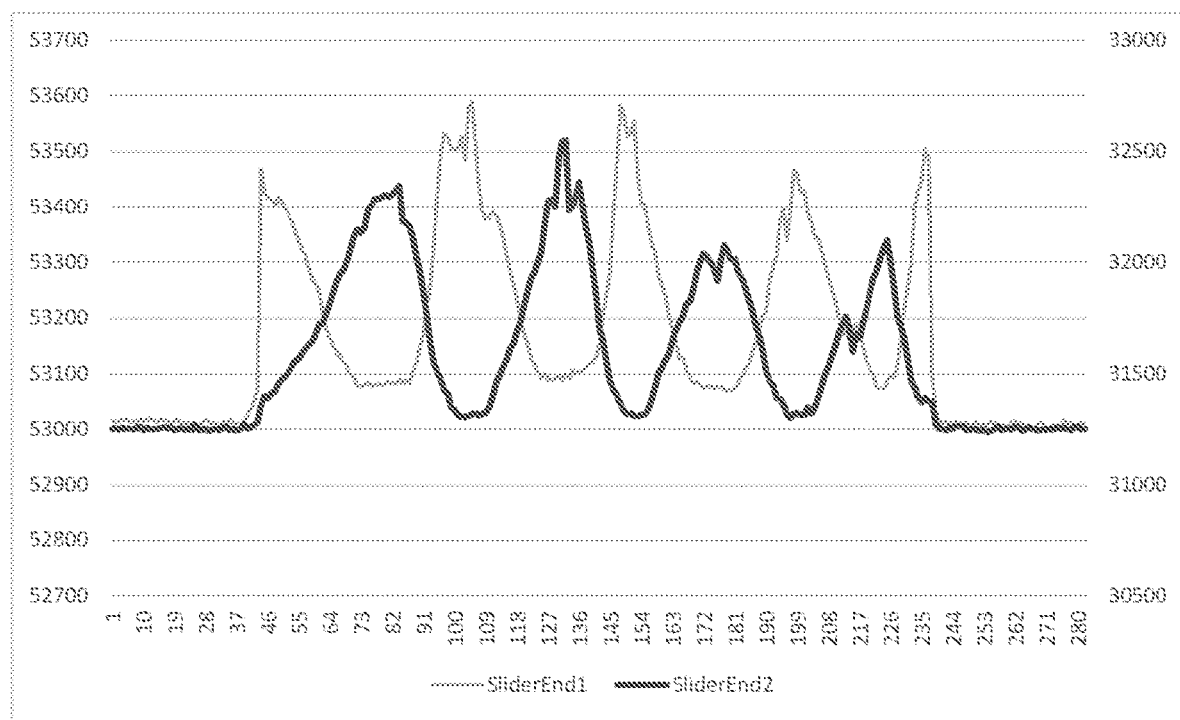

FIG. 15 Shows the changes in the capacitance of the active layer, as measured at two additional conductive layers (45), as an object is moved toward and away from the additional conductive layers (45) thereby signifying a swipe event.

Figure 16:
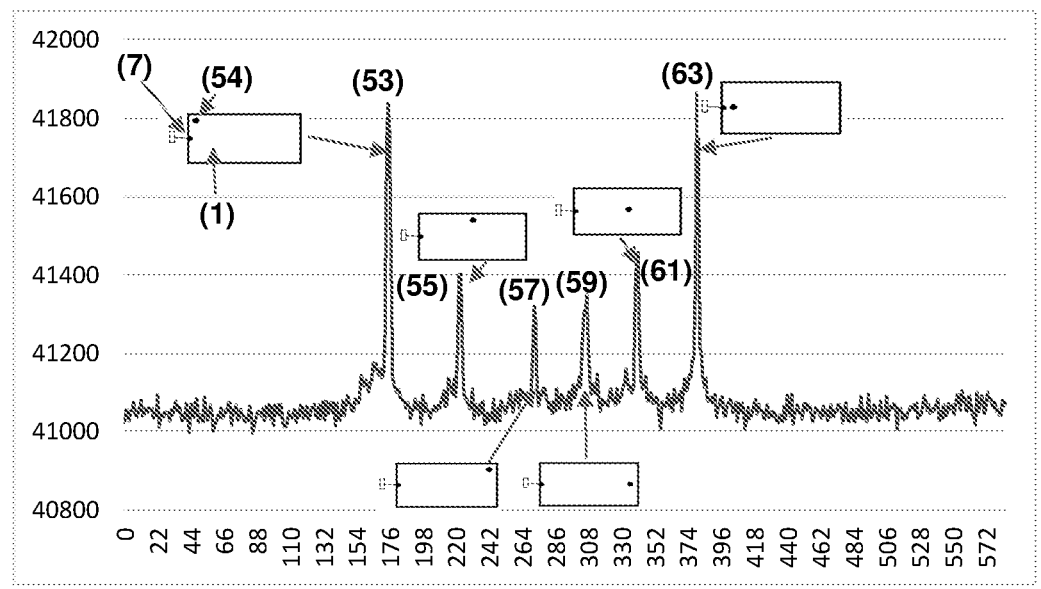

FIG. 16 Shows variation in measured capacitance caused by touches, as a function of distance from the connection point on a plain active layer. The active layer is shown diagrammatically as ☐ (1), the connection point as ⊩ (7), and the touch location on the active layer as • (54). The touches ((53), (55), (57), (59), (61), (63)) closer to the connection point provide larger capacitance readings, due to the resistance of the active layer.

Figure 17:
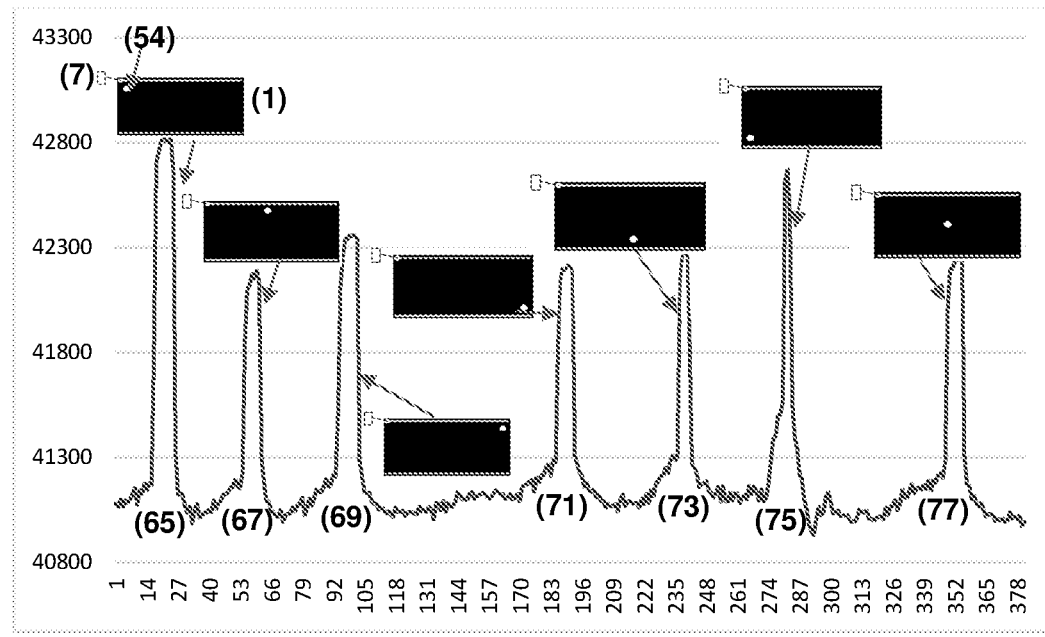

FIG. 17 Shows variation in measured capacitance ((65), (67), (69), (71), (73), (75), and (77)), caused by touches, as a function of distance from the connection point when an additional electrically conductive layer is added. The active layer is shown diagrammatically as ☐ (1), the connection point as ⊩ (7), and the touch location on the active layer as

• (54). The measured touches closer to the additional electrically conductive layer with the connection point provide larger capacitance readings.

Figure 18:
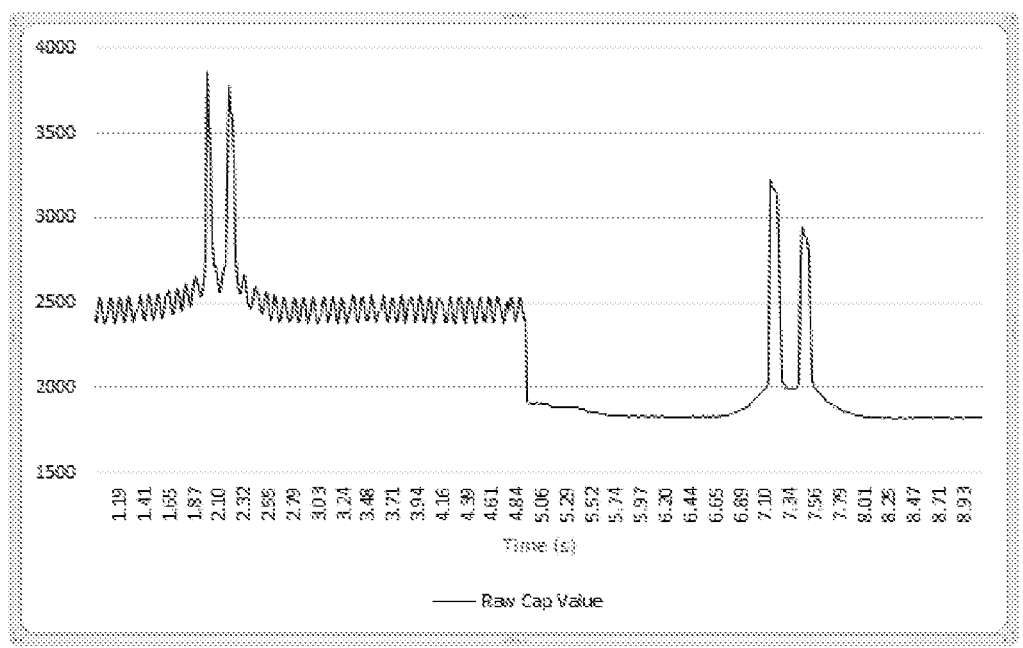

FIG. 18 Shows how signal quality may be affected by mains power electricity in close proximity to the coating system.

DETAILED DESCRIPTION

Definitions

Unless the context clearly requires otherwise, throughout the description and the claims, the words "comprise", "comprising" and the like, are to be construed in an inclusive sense as opposed to an exclusive or exhaustive sense, that is to say, in the sense of "including, but not limited solely to".

"Substrate" or "substrate surface" within the context of this specification is intended to mean the surface to which the touch system is applied to and is intended to include at least: interior walls; exterior walls; fences; ceilings; furniture, doors, tables, cabinetry including drawers, cupboards; driveways, roads, parking spaces; exterior surfaces of vehicles including: automotive vehicles such as cars, trucks; boats; planes. The term 'substrate has been used herein so as to exclude substrates that are capable of rendering electronic text and/or electronic static or dynamic images or are in some other way electrically active. That is, the term 'substrate surface' excludes: handheld devices; electronic devices such as phones, tablets, laptops; televisions; computer monitors; and those types of devices intended to display electronic text and/or electronic static or dynamic images.

As used herein, the term "active layer" is used to mean the layer that is responsible for activity of the touch sensitive system through an electrical property of the active layer.

As used herein, the term "electrically inactive layers" is used to mean a layer that has no electrical active property.

The term "coating" as used herein is intended to mean any material that may be applied to the surface of an object and includes coatings such as paint applied in liquid form, and coatings such as wallpaper or films applied in sheet form.

The term "control" as used herein is intended to include sensing of input signals; monitoring of a control signal; recording of a control signal; transmission of a control signal and/or derivatives of the control signal between electrical devices; causing an action(s) to be performed in relation to the control signal being received by the controller; or any combination of the aforementioned. The system may be used to control any electronic device which requires a control signal to function. Such devices may be as simple as one or more light bulbs, through to one or more computers or microprocessors.

DESCRIPTION

The present invention relates to touch sensitive electronic systems that may be applied to substrates.

The touch sensitive systems of the present invention are able to achieve partial or substantial substrate surface coverage.

The touch sensitive system of the present invention comprises an active layer (1) that may be applied to substrates (11). In order to be active, the active layer (1) has the capability to provide an electrical property after application to a substrate surface sufficient to function as a sensor that is configured, via a suitably connected detector and/or electronic controller, to detect a disruption to the electrical property that is provided by the electrically active layer. Typically an electric current is continuously or non-continuously applied to the active layer. When a user touches the substrate (either the active layer directly, or a non-active layer above the active layer), the touch disrupts or changes an electrical property of the active layer, the controller being configured to detect this disruption or change.

The active layer (1) is configured to have a connecting means (7) with the electronic controller (5). A differentiated touch (3) on a substrate surface (11) disrupts an electrical property in the active layer (1). The disruption of the electrical property in the active layer (1) is interpreted by the electronic controller (5) to execute a command. Electrical properties may include: a conductive property (conductance), a resistive property (resistance), a resistive-capacitive property and an inductive property (induction).

The active layer (1) may include any active material that has an electrical property that may be disrupted. That is, the active layer (1) must be able to conduct and/or retain some electrical charge such that an electric property generated by the electrical charge may be disrupted by a person or animal directly touching the active layer, or indirectly touching the active layer via an intermediate non-conductive layer.

A key feature of the active layer (1) is that active layer (1) must form a 3-dimensional interconnected pathway over at least part of the substrate, or over different parts of the substrate. The 3-dimensional interconnected pathway allows for a possible passage of an electrical current through the active layer (1).

For example, in the case of an active layer where the electrical property of capacitance is detected, all conductive materials are useful to produce a capacitive coating suitable for use as an active layer. Where metals are incorporated into the active layer, stability, particularly to surface oxidation where the metal oxide is non-conductive or of low conductivity, is an important feature in order for the electrical property to be retained for an extended period of time. This may be similarly applied to resistive and inductive active materials.

Electronics

The active layer (1) is connected to an electronic controller (5) through resistive, inductive or capacitive sensing integrated circuits and/or micro control units (MCU) by connecting means (7). The sensing integrated circuits and/or micro control units are capable of sensing changes in the electrical property of the active layer (1) when an object disrupts the electrical property through a differentiated touch (3). When changes in the electrical property are detected by the integrated circuits and/or micro control units, a control signal being, for example, instructions for controlling a controlling relay or a dimmer circuit may be executed. Those of skill in the art will readily understand that the system can be applied to other sensing methods and does not need to be limited to capacitive sensing, provided that the active layer contains the adequate active material to enable a change or disruption to an electrical property to be detected.

Disruptions to the electrical property may be caused by specific human or service animal interactions that the controller is programmed to recognise and differentiate, such as double tapping, triple tapping, multiple tapping, tapping and holding, sliding a hand, arm or leg across the surface or performing the aforementioned interactions on different regions of the active layer.

The electronic hardware, namely the active layer and at least a sensor or intermediate/slave controller connected to the active layer, are connected through a connecting means (7). The connecting means (7) may include a physical connecting means which connects the master controller to the coating, sensor or slave controller, for example over a wired network, or using a physical connection such as silver epoxy, conductive wires, additional electrically conductive layers, a screw plate, physical adhesive, conductive tape. Alternatively the connecting means (7) may be connected via a remote connecting means or wireless network that allows for commands to be executed over a wider, remote configuration. Such remote or wireless connecting means could include any combination of transmitters, receivers, transceivers, Wi-Fi and Bluetooth.

The connecting means (7) may also further comprise an intermediate connector.

Electronic hardware could be configured to be controlled over a wired or wireless network, via computer, mobile phone, or any other connected control device (FIG. 9). The electronic hardware, and in particular the controller, could be networked to other devices in the building, so that global commands and system configuration could be carried out.

The system may be configured to recognise particular types of contact with the active layer (1). For example, the electronic controller (5) could be configured, either by predetermined programming, or in a configuration mode used by a user of the system, to recognise specific gestures and to map those specific gestures to specific control outputs/actions. Examples include: a double tap to turn off a relay; double tap and hold (i.e. a touch of extended duration) to turn on locally connected relays; triple tap and hold to turn off all lights in a building.

An integrated circuit (IC) could be used for sensing, that is, for detecting disruptions in the electrical property of the active layer caused by touching the active layer. The sensing IC could be integrated with, or remote from but connected to, the controller.

The controller may include a real-time clock which could be used to control when and at what times an electrical appliance such as lighting for example is turned on and off.

An external switch may be used to override the controller as a fail-safe. For example, a standard light switch could be retained to override the control of lighting by the electronic controller via the active layer.

Capacitive Sensing

The active layer and the controller may be configured to detect changes in, or disruption to, the capacitance of the active layer, when a current is applied to the active layer to charge the active layer. In the case of capacitive sensing, the active layer is connected at one or more points or nodes, via connecting means (7) to one or more corresponding nodes on the electronic controller (5) The electronic controller may optionally also be independently connected to an electrical earth (FIG. 1A).

The electronic controller (5) determines, by suitable control algorithms and hardware, the capacitance of the active layer (1). For example, the electronic controller (5) may output a constant current into to the active layer (1). An electrical charge will flow into the active layer resulting in an increasing voltage over time, and voltage can be calculated according to equation (1):

$$\Delta V = \frac{I}{C} * \Delta t \quad (1)$$

-continued $\Delta V$ is voltage (volts)

$I$ is current (amperes)

$C$ is capacitance $\Delta t$ is time (seconds)

The electronic controller (5) is able to determine the capacitance by measurement of the voltage across the active layer (1) over a fixed time. When an object, such as a human or animal, touches or comes into contact with the active layer (1), the capacitance of the active layer will change. The electrical properties of the object (e.g. the object's own inherent resistance, capacitance and inductance), and the dielectric properties (thickness and material) between the aforementioned influence the capacitive change measured by the electronic controller. Any capacitance can be interpreted by the electronic controller (5) to issue a command or control signal.

When the active layer (1) or multiple active layers (e.g. (31) and (33)) are configured in a grid pattern as part of a capacitive system, it is preferred that the grid elements are electrically insulated from each other. That is, that there is no material capable of electrical conductivity between the multiple active layers. In some instances some row elements might be connected to other row elements or alternatively, may be connected to other column elements. Some or all of the grid elements can be connected via connecting means to multiple corresponding connecting means (7) to the electronic controller (5) (FIG. 1B). The electronic controller (5) may also be independently connected to an electrical earth.

However, at this stage, the electrical circuit between the grid elements on the conductive active layer and the electronic controller is an open circuit.

Resistive-Capacitive Sensing

In the case of resistive-capacitive sensing, a capacitive active layer may also have resistive properties. The touch sensor system may be configured as a capacitive-based position sensor by formulating the active layer (1) to have resistive-capacitive electrical properties.

Without wishing to be bound by theory, in the case of capacitive-resistive sensing, the active layer (1) may be connected by one or more connecting means (7) to the electronic controller. As seen for capacitive sensing, the electronic controller (5) may be independently connected to an electrical earth.

The electronic controller (5) sequentially measures the capacitance of the active layer (1), at each connecting means (7).

When an object, such as a human, touches to the active layer, the connecting means (7) will measure a change in capacitance. However, due to the series of resistance properties of the active layer (1), the capacitance changes measured by a single connecting means (7) become correspondingly smaller as the object moves further away from the connecting means (7).

By comparing the capacitive difference of two or more connecting means (7), the positional information of the object on the active layer (1) can be determined. This positional information is calculated by electronic controller (5) and can be used to execute a command.

This may be further expanded to include three or more connecting means (7) to provide greater functionality. For example, with three connecting means (7) that are connected along two perpendicular edges of the active layer (1), it is possible to obtain positional information in horizontal and vertical axes, resulting in a 2D positional co-ordinate of the object disrupting the electrical property.

Inductive Sensing

The touch sensor system may also be configured as an inductive sensor by formulating the active layer (1) to have inductive electrical properties (FIG. 3).

The active layer for the inductive sensor is also connected at one or more connecting means (7) to the electronic controller (5), via connecting means (7). The electronic controller may also optionally be independently connected to an electrical earth.

The electronic controller calculates the inductance of the inductive active layer (17). Without wishing to be bound by theory, the inductive active layer (17) may form part of a resonant resistor inductor capacitor electrical circuit when connected to the electronic controller (5).

When the electronic controller (5) applies a short voltage pulse to the inductive active layer (17) (typically in the range of from about 0.1 microseconds to about 100 milliseconds), and the voltage is then released, an oscillating 'ringing' voltage will result, in which the voltage decays over time, as a result of the resistance. The frequency of this oscillating voltage is known as the circuit's resonant frequency. The resonant frequency can be measured by the electronic controller and calculated according to equation (2):

$$f_{res} = \frac{1}{2\pi\sqrt{LC}} \quad (2)$$

$f_{res}$ is resonant frequent (hertz)

$L$ is inductance (henrys)

$C$ is capacitance (farads)

Those of skill in the art will realise that the physical layout of the active layer (1) influences the amount of inductance. For example, the active layer may be arranged in a straight line or alternatively may form a spiral pattern or a loop (FIG. 3). The length and shape of the active layer (1) may therefore have an effect on the amount of inductance.

It will also be understood by those of skill in the art that as an electrical current flows through the active layer, a magnetic field (21) is created. When a magnetically permeable object (19) (e.g. a metal pen/stylus) is touched against the inductive active layer (17), the permeability of the material will cause the inductance to change (23). This change in inductance, can be interpreted by the electronic controller and used to issue a command.

Resistive Sensing

The touch sensor system may further be configured as a resistive sensor by formulating the active layer to have resistive electrical properties.

The active layer should be connected at two or more connecting means (7) to the electronic controller (5). The two or more connecting means (7) are required to provide a complete electrical circuit. However, one of the connecting means (7) may be an electrical earth. At this stage, the electrical circuit between the resistive active layer (1b) and the electronic controller is a closed circuit (FIG. 4).

The electronic controller outputs a constant voltage across the resistive active layer while simultaneously measuring an electrical current through the resistive active layer (1b). The voltage, current and resistance are linked by way of Ohm's Law.

When an object, such as a human or animal, touches a portion of the resistive active layer (1b), it will result in a lower resistance (than resistance prior to the touch event) and therefore greater electrical current (than current prior to the touch event). The increased current, can be interpreted by the electronic controller (5), and used to issue a command. Ideally in a resistive system, the resistive active layer is preferably configured as a strip (FIG. 4, (1b)).

The resistive active layer (1b) may also be connected at a single connecting means (7) to the electronic controller (5). The electronic controller (5) must also be independently connected to an electrical earth. At this stage, the electrical circuit between the resistive active layer and the electronic controller (5) is an open circuit (FIG. 5).

The electronic controller (5) outputs a constant voltage onto the resistive active layer (1b) while simultaneously measuring any electrical current that might flow through the resistive active layer (1b). While the electrical circuit is open, no current flows. However, if an electrically earthed object, such as a human or animal, touches the resistive active layer, a resistance will be formed between the resistive active layer (1b) and electrical earth. An electrical current will now be able to flow, by way of Ohm's Law, and can be interpreted by the electronic controller to issue a command.

Time of Flight Sensing

The touch control system may also be configured as part of a so called 'time of flight' sensor.

The active layer is connected at a single connecting means (7) to the electronic controller (5). It is required for the electronic controller (5) to be independently connected to an electrical earth. However, the active layer can optionally be connected to electrical earth via an appropriate termination resistor. The termination resistor is preferentially located at a node that is the electrically farthest away node from the electronic controller.

The time of flight sensory system works by the electronic controller (5) outputting a short voltage pulse onto the active layer (1) (typically between about 1 pico second and 1 micro second). The short voltage pulse may consist of an oscillating voltage waveform. The voltage pulse propagates along the active layer. However, if an object such as a human or animal touches the active layer (1), part of the voltage pulse will be absorbed by the object. Part of the pulse will then be directed back towards the electronic controller. This phenomenon is known as an impedance discontinuity. Once the electronic controller (5) senses the returned voltage pulse, the electronic controller (5) can determine the time has taken for the voltage pulse to travel from the electronic controller (5) to the object and back to the electronic controller (5). Such information can be interpreted by the electronic controller (5) to issue a command.

Active Layer

Conductive carbon black pigments may provide convenient and cost effective materials for use in the active layer. Incorporation of pigments into conventional coatings at appropriate levels (exceeding the concentration required to pass the percolation threshold) produce coatings with conductive resistive properties that are easily altered by the type and amount of carbon black added as well as by the state of carbon black dispersion. Typically more than 5 mass % of highly conductive carbon black are required to obtain conductivity in the active layer and more useful conductivity is afforded above 10 or 20 mass %. However, at these levels the mechanical properties of the active layer become compromised and appropriate polymeric binding agents and formulating techniques are required to allow uniform film formation without cracking which leads to reduced conductivity and worst case no conductivity.

The active layer (1) may be applied as a coating material or alternatively the active layer may be covered with a coating material in a sandwich or laminate type arrangement in FIG. 6 to FIG. 8. Such coating materials may include paint formulations, lacquers and gels.

Touch Detection

The present invention is designed to detect an intentional touch (and not a false touch) on the substrate surface when an object changes the capacitance of the active layer is disrupted. For the purpose of the present invention, false touches could be generated by a person or animal brushing against the substrate surface; a person or object leaning against the substrate surface; electrical noise sources; or random noises.

The present invention may overcome the problem of false touches by the use of suitable control algorithms in the electronic controller (5) (FIG. 10 and FIG. 11). The control algorithms (FIG. 10 and FIG. 11) are capable of detecting the number of taps on the surface, and/or a pattern of taps, and/or or the duration of the disruption to the capacitance of the active layer. The control algorithms may therefore distinguish between a single touch or tap of short duration, which might be a false touch which is not intended to generate a control signal, from a true touch, which is intended to generate a control signal. The control algorithms do this by dismissing any single touch below a predetermined duration, or below a predetermined measure of disruption of the electric property.

The control algorithms also work with low signal to noise environments, and also work well to filter out noise associated with a slow increase or decrease of offset capacitance such as might occur when a user leans against a wall or touches the wall while also tapping.

It has been found by the present inventors that two or more tap events are more likely to remove false touch events than a single tap or touch. This therefore, provides improved reliability that the disruption of the capacitance is a result of an intentional, true touch event, rather than false touch event disruption. True touch events may incorporate a number of touches and/or a measure of for how long the touch event has occurred. This allows for the detection of multiple tap events, tap and hold events as different commands, and allows the control algorithms to provide, and distinguish between, a number of different commands.

A control algorithm processes the input data (35) and (41), as shown in FIG. 10 and FIG. 11, to create edge detection data (37) and (43). An edge detection algorithm compares this to a threshold to set the current state (34) and (42) to one of 3 states: Touch On (value=1), Touch Off (value=−1), or No Touch (value=0). Data is then fed into a decision tree along with current time to count the number of touch events that have occurred ((39) and (44)). Once no touches have been detected for a set time, the final count of occurred touches is recorded and a touch event generated.

The control algorithm may be able to process, recognise, and generate particular outputs in response to, multiple different gestures. The gestures may differ in the number of taps and holds, and/or the duration of the taps and holds. The controller may be configured such that each gesture generates a corresponding control action such as turning on lights, changing dimming settings, or turning off all lights in a particular area of a building.

The present invention may also incorporate gestures such as a swipe event where functionality is similar to a slider used to control domestic electrical appliances. Swipe events open up the number of options available as input signals and commands. Swipe events could be used to control activities in the home such as dimming lights or other indications. Further, swipe events on the substrate surface may be implemented by incorporating a two layer system together with two additional electrically conductive layers, having an area that is less than the area of the active layer in the form of strips or channels (e.g. as shown in FIG. 1B, FIG. 3, FIG. 8). One, two or more channels of additional electrically conductive material may be used for this purpose as shown in (FIG. 8).

In one example, the swipe event is implemented on a wall with a two layer system having an active layer (such as conductive carbon paint), and additional electrically conductive areas (such as copper paint) (45) in the form of horizontal strips, located on the upper and lower edges of the active layers (FIG. 12). The capacitance measured at each respective additional conductive strip is inversely proportional to the distance between the additional conductive strip and the touch location; the difference in measured capacitance at each additional conductive strip allows for calculation of the touch location.

FIG. 13 shows five distinct touches; the three in the centre signify touches equidistant from the additional electrically conductive layers (45). The first touch (47) is closer to one additional electrically conductive layer (45), while the last touch (51) is closer to the other additional electrically conductive layer (45).

Arrangement of the Active Layer

The active layer (1) may be applied under and/or on top of other layers (25), (27), (45). Other layers may be selected from primers/sealers (25), additional electrically active layers (45), topcoats (27), and base layers (25).

It is also possible to have more than one active layer on a substrate surface. When there is more than one active layer, the active layers may be sandwiched between a non-conductive layer (30). The layers may be arranged, for example, as shown in FIG. 6 to FIG. 8. Those of skill in the art will realise that the layers may have alternative arrangements to those shown herein.

Where the active layer (1) is used in conjunction with additional electrically conductive layers (45), the additional electrically conductive layers may be arranged as strips or bands on the periphery of the active layer (1) as shown in FIG. 12. Alternatively, the additional electrically conductive layer (45) may also be arranged in vertical or horizontal series as shown in FIG. 8. An important feature is that the electric property generated by current passing through the layers may still be disrupted by a manual touch event. In other words, the arrangement of conductive elements in the active layer (1) is such that disruptions to the selected electric property of the active layer may be detected by the controller. The change or disruption in electric property may be generated from a passive electric field in that the coating may not require an active power source as such. With a controller of suitable sensitivity, a relatively small disruption in the passive electric property caused by the touch of a user may be detected without electricity being supplied to the active coating.

The additional electrically conductive layer may take the form of a horizontal strip derived from a conductive material such as copper paint or similar between the sliding points.

The capacitance measured at each respective additional conductive layer is inversely proportional to the distance between the additional conductive layer and the touch location; the difference in measured capacitance at each additional conductive layer allows for calculation of the touch location.

A problem of some prior art systems is that low cost conductive paints used for an active layer have high resistance, which also means that they have low conductance. Therefore, the capacitive signal of the active layer is smaller, the further away the touch occurs from the controller.

The present invention solves the problem by using an additional electrically conductive layer and/or a connecting means. The additional electrically conductive layer (45) and/or a connecting means (7) must have lower resistance and higher conductivity than the active layer. The higher conductivity prevents the signal from dropping off or diminishing in intensity, and may be seen in FIG. 16.

The present inventors also found that some of the prior art system were problematic when applied to larger substrates. Mains electricity supply in close proximity to a coating system, increased the amount of noise observed, which in turn affected the noise to signal ratio making it harder for a touch event to be detected by the controller when the capacitance was disrupted. The present inventors have established that synchronising the measurements (resistance and/or capacitance and/or inductive measurements) of the conductive active layer by the electronic controller with the same frequency of the mains electrical supply may avoid the problem of electrical noise (see FIG. 18).

It will be appreciated that the above described touch sensitive system may find application anywhere where touching an otherwise passive substrate could be used to control an electrical device. Such appliance device might be a light for example, or might be an alarm, or might be a motor or other electrical actuator used to move an object such as a door or gate or lock, or a relay which is used to connect a circuit to control an electrical appliance. Further, more detailed examples have been provided above.

The following provides two non-limiting example compositions for forming an active layer in accordance with the current invention:

General Procedure A:

With mixing, a 20% portion of water was added to 25% of an alkali soluble dispersion followed by 25% of alkali. The mixture was stirred until a clear solution was obtained. With continued mixing, the surfactant, propylene glycol and defoamer were added and the mixture stirred under high shear conditions (e.g. high speed mixer with a cowles blade) while carbon black powder was slowly added in portions. Viscosity was adjusted by portion-wise addition of water until a paste was produced. The paste was further processed to break agglomerates and produce a fine dispersion. A fine dispersion was achieved by additional processing methods by adjusting the viscosity with a further 50% of the total water and, after transferring the mixture to a round vessel, adding zirconia dispersion beads and subjecting the vessel to rotation by placing the vessel on a roller for several days. After the additional processing, the dispersion beads were removed by filtration and the remaining water, alkali soluble acrylic dispersion, alkali and biocide were added. After thoroughly mixing all components to a homogeneous state the material was ready for use.

| Material Type | Supply Name | Mass % |
| --- | --- | --- |
| Surfactant | Genapol O 080 (EFKA) | 0.5 |
| Propylene Glycol | | 5.5 |
| Defoamer | Foamstar SI 2250 (BASF) | 0.3 |

-continued

| Material Type | Supply Name | Mass % |
| --- | --- | --- |
| Conductive carbon powder | Printex XE2B (Orion Engineered Carbon) | 5.5 |
| Alkali Soluble acrylic dispersion (solid component) | Viscopol 7396 (Nuplex) or Primal I-98 (Dow) | 17.4 |
| Water | | 67.2 |
| Biocide | Acticide MBS (Thor) | 0.1 |
| Alkali | 10% aq. Alkali hydroxide or 25% aqueous ammonia | 3.4 |
| | | 100 |

General Procedure B:

To the alkali soluble acrylic dispersion was added 50% of the total water, alkali, wetting agent, defoamer and rheology modifier. The mixture was stirred until all rheology modifier had dissolved. Conductive metal powders were added while stirring and after complete wetting of the powders the remaining water and biocide were added. After mixing to a homogeneous state the coating was ready for use.

| Material Type | Supply Name | Mass % |
| --- | --- | --- |
| Alkali Soluble acrylic dispersion (solid component) | Viscopol 7396 (Nuplex) or Primal I-98 (Dow) | 11.4 |
| Water | | 66.9 |
| Biocide | Acticide MBS (Thor) | 0 |
| Alkali | 10% aq. Alkali hydroxide or 25% aqueous ammonia | 0.4 |
| Defoamer | Foamstar SI 2250 (BASF) | 1.0 |
| Wetting agent | Surfynol 104DPM (Air Products) | 0.8 |
| Rheology modifier | Natrosol PLUS D330 (Ashland) | 0.4 |
| Conductive metal powder | eConduct 421000 (Eckart) | 3.8 |
| Conductive metal powder | eConduct 122000 (Eckart) | 15.3 |

The invention claimed is:

1. A touch sensitive liquid coating system comprising a liquid coating configured to be applied to a non-electronic display substrate surface in liquid form, the non-electronic display substrate surface including any one of walls, floors, ceilings, doors, cabinetry, furniture or vehicles, the touch sensitive liquid coating system comprising:
   at least one electrically active layer formed by the liquid coating when applied to the non-electronic display substrate surface and having a number of electrical properties including:
   a) a capacitive property (capacitance);
   b) a resistive property (resistance); and
   c) a capacitive-resistive property
   an electronic controller;
   wherein the active layer is selected to particularly exhibit or enhance at least one of the number of electrical properties,
   wherein the at least one electrically active layer is configured to have an electrical connection with the electronic controller,
   wherein the electronic controller is configured to detect a differentiated touch on the non-electronic display substrate surface, that disrupts the at least one electrical property of the at least one electrically active layer and which is detected by the electronic controller to provide a control signal to actively control an electrical device,
   wherein the controller is further configured to dismiss false touch being:
   a non-intentional touch generated by a person or object brushing against the substrate surface;

a person or object leaning against the substrate surface; electrical noise sources; or
random noises by dismissing any single touch:
below a predetermined duration,
below a predetermined measure of disruption of the selected at least one electrical property, or
by filtering out the noise associated with a slow increase or decrease of the at least one electrical property, and
wherein the differentiated touch is selected from:
one or more of multiple sequential touches,
one or more touches of extended duration, or
a combination thereof,
wherein the at least one electrically active layer comprises an active material, and
wherein the active material is present in the at least one electrically active layer in the range of from about 1% w/w to about 30% w/w of the at least one electrically active layer.

2. The touch sensitive liquid coating system of claim 1, wherein the control signal is transmitted wirelessly.

3. The touch sensitive liquid coating system of claim 1, wherein the disruption to the at least one electrical property of the at least one electrically active layer is transmitted wirelessly to the electronic controller for processing, generation of the control signal and system monitoring.

4. The touch sensitive liquid coating system of claim 1, having two or more electronic controllers that connect the at least one electrically active layer to a network.

5. The touch sensitive liquid coating system of claim 4, wherein the non-electronic display substrate surface has an area greater than 0.5.

6. The touch sensitive liquid coating system of claim 1, wherein the electrical device controlled by the control signal is lighting.

7. The touch sensitive liquid coating system of claim 1, wherein the at least one electrically active layer substantially covers the non-electronic display substrate surface.

8. The touch sensitive liquid coating system of claim 1, wherein the at least one electrically active layer partially covers the non-electronic display substrate surface.

9. The touch sensitive liquid coating system of claim 8, wherein the at least one electrically active layer comprises one or more active regions.

10. The touch sensitive liquid coating system of claim 9, wherein the one or more active regions are configured to provide a plurality of discrete active regions each of which, or one or more of which, when touched is configured to provide a different control function of a common electrical device, and/or to control a different electrical device.

11. The touch sensitive liquid coating system of claim 1, wherein the non-electronic display substrate surface has an area greater than 0.05 m$^2$.

12. The touch sensitive liquid coating system of claim 1, wherein the active material is responsible for providing the at least one electrical property of the at least one electrically active layer.

13. The touch sensitive liquid coating system of 12, wherein the active material comprises any one or more of carbon; metals; metal coated materials; and metal oxides or a combination thereof.

14. The touch sensitive liquid coating system of claim 1, wherein the at least one electrically active layer comprises film forming polymers selected from: acrylic copolymers; polyurethanes; epoxies; hydrocarbon polymers; modified hydrocarbon polymers; polycarbonates; polyesters, including natural oil derived polymers, alkyds; silicone polymers; mixtures and hybrid polymers of the aforementioned.

15. The touch sensitive liquid coating system of claim 1, wherein the at least one electrically active layer is operated through one or more dielectric layers and the one or more dielectric layers comprise dielectric material selected from the group consisting of polymers, coatings, ceramics, cementitious materials, wood and wood composites, paper, cardboard, wallpaper, vinyl, laminates and glass.

16. The touch sensitive liquid coating system of claim 1, wherein the at least one electrically active layer is coated with at least one topcoat layer.

17. The touch sensitive liquid coating system of claim 16, wherein the at least one topcoat layer provides an aesthetic feature.

18. An electronic controller configured for use with, or to comprise part of, the touch sensitive liquid coating system of claim 1.

19. A touch sensitive liquid coating system comprising a liquid coating configured to be applied to a non-electronic display substrate surface in liquid form, the non-electronic display substrate surface including any one of walls, floors, ceilings, doors, cabinetry, furniture or vehicles, the touch sensitive liquid coating system comprising:
at least one electrically active layer formed by the liquid coating when applied to the non-electronic display substrate surface and having:
a resistive property (resistance); and
an electronic controller;
wherein the at least one electrically active layer is configured to have an electrical connection with the electronic controller; and
wherein the electronic controller is configured to detect a differentiated touch on the non-electronic display substrate surface, that disrupts the resistive property of the at least one electrically active layer and which is detected by the electronic controller to provide a control signal to actively control an electrical device,
wherein the controller is further configured to dismiss false touch being:
a non-intentional touch as could be generated by a person or object brushing against the substrate surface;
a person or object leaning against the substrate surface; electrical noise sources; or
random noises by dismissing any single touch:
below a predetermined duration,
below a predetermined measure of disruption of the resistive property, or
by filtering out the noise associated with a slow increase or decrease of the resistive property, and
wherein the differentiated touch is selected from:
one or more of multiple sequential touches,
one or more touches of extended duration, or
a combination thereof,
wherein the at least one electrically active layer comprises an active material,
wherein the active material is present at a level exceeding the percolation threshold for the at least one electrically active layer where the percolation threshold denotes the lower limit of conductivity for a particular active material in an active layer, and
wherein the active material is present in the at least one electrically active layer in the range of from about 1% w/w to about 30% w/w of the at least one electrically active layer.

20. The touch sensitive liquid coating system of claim 19, wherein the active material comprises of carbon.

21. A touch sensitive liquid coating system comprising a liquid coating configured to be applied to a non-electronic display substrate surface in liquid form, the non-electronic display substrate surface including any one of walls, floors, ceilings, doors, cabinetry, furniture or vehicles, the touch sensitive liquid coating system comprising:
- at least one electrically active layer formed by the liquid coating when applied to the non-electronic display substrate surface and having a resistive property (resistance); and
- an electronic controller;
- wherein the at least one electrically active layer is configured to have an electrical connection with the electronic controller,
- wherein the electronic controller is configured to detect a differentiated touch on the non-electronic display substrate surface, that disrupts the resistive property of the at least one electrically active layer and which is detected by the electronic controller to provide a control signal to actively control an electrical device,
- wherein the controller is further configured to dismiss false touch being:
  - a non-intentional touch generated by a person or object brushing against the substrate surface;
  - a person or object leaning against the substrate surface;
  - electrical noise sources; or
  - random noises by dismissing any single touch:
    - below a predetermined duration,
    - below a predetermined measure of disruption of the resistive property, or
    - by filtering out the noise associated with a slow increase or decrease of the resistive property;
- wherein the differentiated touch is selected from:
  - one or more of multiple sequential touches,
  - one or more touches of extended duration, or
  - a combination thereof,
- wherein the at least one electrically active layer comprises an active material, and
- wherein the active material is present in the at least one electrically active layer in the range of from about 1% w/w to about 30% w/w of the at least one electrically active layer.

* * * * *